(12) United States Patent
Moore et al.

(10) Patent No.: US 6,328,221 B1
(45) Date of Patent: Dec. 11, 2001

(54) METHOD FOR CONTROLLING A GAS INJECTOR IN A SEMICONDUCTOR PROCESSING REACTOR

(75) Inventors: Gary M. Moore, Los Gatos; Katsuhito Nishikawa, San Jose, both of CA (US)

(73) Assignee: Moore Epitaxial, Inc., Tracy, CA (US)

( * ) Notice: Subject to any disclaimer, the term of this patent is extended or adjusted under 35 U.S.C. 154(b) by 0 days.

(21) Appl. No.: 09/501,329

(22) Filed: Feb. 9, 2000

(51) Int. Cl.⁷ ................................................. B05B 17/00
(52) U.S. Cl. .................................................. 239/1; 118/715
(58) Field of Search ................................... 239/1; 118/715

(56) References Cited

U.S. PATENT DOCUMENTS

| | | | |
|---|---|---|---|
| 4,928,626 | * 5/1990 | Carlson et al. | 118/715 |
| 5,053,247 | 10/1991 | Moore | 427/55 |
| 5,207,835 | 5/1993 | Moore | 118/725 |
| 5,444,217 | 8/1995 | Moore et al. | 219/405 |
| 5,580,388 | 12/1996 | Moore | 118/728 |
| 5,601,107 | 2/1997 | Moore et al. | 137/15 |
| 5,683,518 | 11/1997 | Moore et al. | 118/730 |
| 5,710,407 | 1/1998 | Moore et al. | 219/405 |
| 5,746,834 | 5/1998 | Hanley | 118/715 |
| 5,802,099 | 9/1998 | Curran et al. | 374/131 |
| 5,820,686 | 10/1998 | Moore | 118/730 |
| 5,843,234 | 12/1998 | Finn et al. | 118/715 |
| 5,872,632 | 2/1999 | Moore | 356/381 |
| 6,080,241 | * 6/2000 | Li et al. | 118/715 |

* cited by examiner

Primary Examiner—Lesley D. Morris
(74) Attorney, Agent, or Firm—Gunnison, McKay & Hodgson, L.L.P.; Serge J. Hodgson

(57) ABSTRACT

A single computer controls both a reactor and a gas jet assembly in a system. The gas jet assembly is mounted to the reactor such that a gas injector extends into the reactor. The gas injector includes a bent tip which extent at an angle away from the longitudinal axis of the gas injector. The gas jet assembly controls both the angular and longitudinal positions of the gas injector. By controlling the longitudinal position of the gas injector, the gas jet assembly controls the location at which process gas is introduced into the reactor. Further, by controlling the angular position of the gas injector, the gas jet assembly controls the direction in which process gas is introduced into the reactor.

26 Claims, 12 Drawing Sheets

METHOD FOR CONTROLLING A GAS INJECTOR IN A SEMICONDUCTOR PROCESSING REACTOR

FIELD OF THE INVENTION

The present invention relates generally to semiconductor process equipment. More particularly, the present invention relates to a method for controlling a gas injector in a semiconductor processing reactor.

BACKGROUND OF THE INVENTION

Semiconductor processing typically involved the formation of one or more layers on a semiconductor substrate. For example, silicon epitaxy, sometimes called epi, was a process in which one or more layers of single-crystal (monocrystalline) silicon were deposited on a monocrystalline silicon wafer.

To form a layer on a substrate, a process gas, typically a reactive gas, was introduced into a reactor containing the substrate. The process gas reacted to form the layer on the substrate.

As the art moves towards reduced feature size integrated circuits, it has become increasingly important that the deposited layer has a uniform thickness. One primary parameter, which affected the thickness uniformity of the deposited layer, was the flow characteristics of the process gas into and through the reactor. These flow characteristics were controlled to a large extent by the gas injectors through which the process gas was introduced into the reactor.

To obtain the desired thickness uniformity, the gas injectors were calibrated. Calibration was typically an iterative manual process in which a first layer was deposited on a first test substrate, the thickness uniformity of the first layer was measured, and the gas injectors were manually adjusted in an attempt to improve the thickness uniformity. A second layer was then deposited on a second test substrate, the thickness uniformity of the second layer was measured, and the gas injectors were again manually adjusted. This trial and error manual procedure was repeated until the desired thickness uniformity was obtained.

To allow the gas injectors to be calibrated in the above manner, the gas injectors had to be readily and repeatably adjustable. Finn et al., U.S. Pat. No. 5,843,234, which is herein incorporated by reference in its entirety, teaches a gas jet assembly in which the direction of a nozzle of the assembly was controlled by a positioning device. By manually adjusting micrometer knobs of the positioning device, the direction of the nozzle, and therefore the direction in which process gas was introduced into the reactor, was controlled.

To adjust the micrometer knobs of the positioning device, the person who operated the reactor (the operator) had to physically go to the positioning device and turn the micrometer knobs by hand. This required the operator to leave the reactor controls temporarily unattended, which was undesirable. Further, turning the micrometer knobs by hand was relatively labor intensive and carried an inherent chance of operator error in micrometer knob adjustment.

The gas jet assembly of Finn et al. pivoted the nozzle relative to the reactor. Although allowing for pivoting of the nozzle, the gas jet assembly did not allow the nozzle to be moved in and out of the reactor. However, it is desirable to not only be able to control the direction of the process gas into the reactor, but also to be able to control the location within the reactor at which the process gas is introduced.

It was also important to avoid contamination of the reactor to allow high purity layers to be deposited. One potential source of contamination was the metal, e.g., stainless-steel, of the nozzle. In particular, the metal nozzle was often etched during processing, and this etched metal contaminated the deposited layer. To avoid etching of the metal nozzle, shielding was used in an attempt to isolate the metal nozzle from the activated process gas in the reactor. Although the shielding was relatively effective, etching of the metal nozzle was observed depending upon the particular process performed.

SUMMARY OF THE INVENTION

In accordance with the present invention, a system in which a single computer controls both a reactor and a gas jet assembly is presented. In one embodiment, the gas jet assembly is mounted to the reactor such that a gas injector extends vertically up and into the reactor, i.e., the longitudinal axis of the gas injector is vertical. The gas injector includes a bent tip which extends at an angle away from the longitudinal axis of the gas injector.

Advantageously, the gas jet assembly controls both the angular and longitudinal positions of the gas injector. By controlling the longitudinal position of the gas injector, the gas jet assembly controls the location at which process gas is introduced into the reactor. Further, by controlling the angular position of the gas injector, the gas jet assembly controls the direction in which process gas is introduced into the reactor.

Recall that in the prior art, the nozzle of the gas jet assembly was pivotable relative to the reactor. However, the gas jet assembly did not allow the nozzle to be moved in and out of the reactor. This limited the ability to control the location within the reactor at which the process gas was introduced, and hence, limited the ability to control the process.

In contrast, the gas injector is readily moved in and out of the reactor, and rotated, by the gas jet assembly. Accordingly, greater process control is obtained using the gas jet assembly in accordance with the present invention than in the prior art.

Further, in one embodiment, the operation of the gas jet assembly, and thus the angular and longitudinal positions of the gas injector, is based on information supplied by an operator. Advantageously, the gas injector is moved automatically without manual intervention.

Recall that in the prior art, the operator physically had to go to the positioning device and turn micrometer knobs by hand to adjust the nozzle of the gas jet assembly. This required the operator to leave the reactor controls temporarily unattended, which was undesirable. Further, turning the micrometer knobs by hand was relatively labor intensive and carried an inherent chance of operator error in micrometer knob adjustment.

In contrast, use of the gas jet assembly in accordance with the present invention eliminates the prior art requirement of manually adjusting micrometer knobs. As a result, labor is saved and operator error is reduced. This, and turn, results in a lower overall operating cost of the reactor. Further, the gas jet assembly precisely controls the longitudinal and angular positions of the gas injector. Accordingly, the direction and position at which process gas is introduced into the reactor is precisely controlled.

In accordance with another embodiment of the present invention, a method of controlling a gas injector in a reactor with a gas jet assembly includes selecting a first gas injector position for a first process operation, e.g., for an etch cleaning of substrates in the reactor. The gas injector is moved by the gas jet assembly automatically to the first gas injector position without manual intervention. The first process operation is performed.

A determination is made that a second process operation is still to be performed. For example, the second process operation is a layer deposition on the substrates. A new second gas injector position for the second process operation is selected. The gas injector is moved by the gas jet assembly automatically to the second gas injector position without manual intervention. The second process operation is performed.

Thus, in accordance with the present invention, the gas injector is moved to a gas injector position which provides the best results for each process operation. In this manner, each process operation is optimized. This is in contrast to the prior art where a single gas injector position was used for all process operations, and the single gas injector position was less than ideal depending upon the particular process operation.

In another embodiment, a first batch of substrates is processed. A determination is made that a second batch of substrates is still to be processed. The characteristics of the processed substrates from the first batch are measured, for example, the thickness uniformity of a layer deposited on at least one of the processed substrates is measured. Based on these measured characteristics, a new second gas injector position for the second batch of substrates is selected. The gas injector is moved by the gas jet assembly automatically to the second gas injector position without manual intervention. The second batch of substrates is processed.

Advantageously, substrate characteristics from a previous batch are used to optimize the gas injector position for the next batch. In this manner, deviations in process conditions from batch to batch are automatically compensated for resulting in consistent substrate processing from batch to batch.

In another embodiment, a process operation is initiated and a gas injector is moved during performance of the process operation by a gas jet assembly. For example, the gas injector is rotated and/or moved in the longitudinal direction.

In accordance with this embodiment, the operational conditions in the reactor are monitored during the process operation. The optimum gas injector position is determined based on the monitored operational conditions. The gas jet assembly moves the gas injector to the optimum gas injector position. The operational conditions of the reactor are continuously monitored, and the gas injector is continuously moved to the optimum gas injector position during the entire process operation.

Thus, in accordance with the present invention, the gas injector position is responsive to the operational conditions existing in the reactor at all times. In this manner, instantaneous deviations in operational conditions are automatically compensated for resulting in the most optimum processing of the substrates.

In one embodiment, a gas jet assembly includes a gas injector having a longitudinal axis, a first motor coupled to the gas injector and a second motor coupled to the gas injector. The first motor controls a position of the gas injector along the longitudinal axis of the gas injector. The second motor controls the angular position of the gas injector around the longitudinal axis of the gas injector.

In one particular embodiment, the gas jet assembly includes a shaft support, a hollow shaft extending concentrically through the shaft support, and a slider movably supported on the shaft support. The first end of the shaft is located within the slider and a gas injector is coupled to the slider. During use, process gas is supplied to the shaft. The process gas flows from the shaft through the slider and into the gas injector.

To use the gas jet assembly, a seal is formed between the slider and the shaft, e.g., with an O-ring. As set forth above, the gas injector is coupled to the slider. The gas injector is moved by moving the slider relative to the shaft.

In other embodiments, a gas jet assembly includes a pivotable gas injector. By having the ability to pivot the gas injector, greater control of process gas introduction into the reactor is obtained. Further, the gas injector is formed of a nonmetallic material such as quartz, graphite or ceramic. By forming the gas injector of nonmetallic materials, contamination from the metal of nozzles of the prior art is avoided.

In the prior art, the gas jet assembly imparted significant stress on the gas nozzle and so the gas nozzle was formed of metal to avoid cracking and failure of the gas nozzle. Recall that shielding was used in an attempt to avoid etching of the metal nozzle and thus to avoid metal contamination of the deposited layer. However, etching of the metal nozzle was still observed depending upon the particular process performed.

Advantageously, the gas injector is pivotable and thus provides flexibility in controlling process gas flow characteristics into and through the reactor. Yet, the gas injector is formed of a nonmetallic material thus avoiding metal contamination of the prior art. In addition, by forming the gas injector of an infrared transparent material as those of skill in the art will understand, e.g., of quartz, heating of the gas injector is minimized thus minimizing deposit formation on the gas injector.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

In accordance with the present invention, a system (FIG. 4) in which a single computer 400 controls both a reactor 133A and a gas jet assembly 100A is presented. In one embodiment (FIGS. 5A, 5B), gas jet assembly 100A is mounted to reactor 133A such that a gas injector 130A extends vertically up and into reactor 133A, i.e., longitudinal axis 111A of gas injector 130A is vertical. Gas injector 130A includes a bent tip 131A, which extents at an angle away from longitudinal axis 111A of gas injector 130A.

Advantageously, gas jet assembly 100A controls both the angular and longitudinal positions of gas injector 130A. For example, referring to FIG. 5A, tip 131A of gas injector 130A is moved from a first angular position at position 504 to a second angular position at position 506. By controlling the angular position of gas injector 130A, gas jet assembly 100A controls the direction in which process gas is introduced into reactor 133A.

Figure 5B:
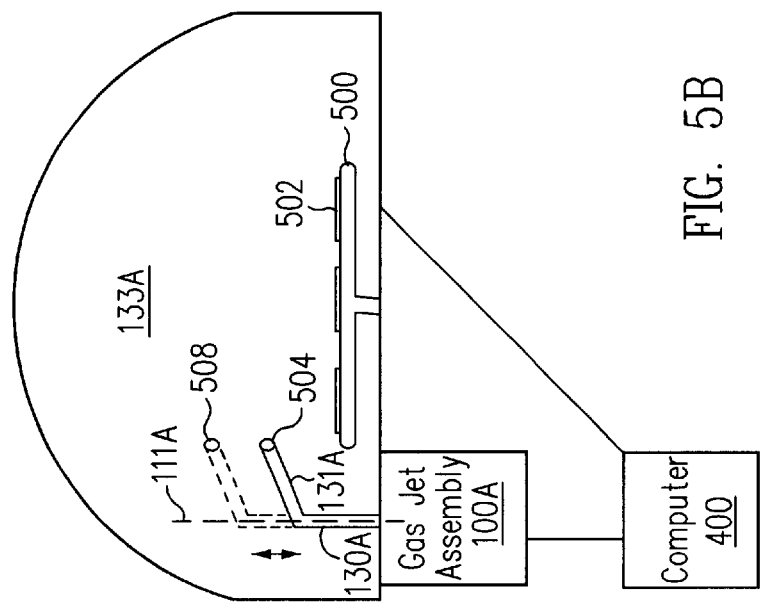
FIGS. 5A, 5B are simplified side views of a reactor and a gas jet assembly in accordance with the present invention.

As a further example, referring now to FIG. 5B, tip 131A of gas injector 130A is moved upwards from a first longitudinal position at position 504 to a second longitudinal position at position 508. By controlling the longitudinal position of gas injector 130A, gas jet assembly 100A controls the location at which process gas is introduced into reactor 133A.

Recall that in the prior art, the nozzle of the gas jet assembly was pivotable relative to the reactor. However, the gas jet assembly did not allow the nozzle to be moved in and out of the reactor. This limited the ability to control the location within the reactor at which the process gas was introduced, and hence, limited the ability to control the process.

In contrast, gas injector 130A is readily moved in and out of reactor 133A, and rotated, by gas jet assembly 100A. Accordingly, greater process control is obtained using gas jet assembly 100A in accordance with the present invention than in the prior art.

Further, in one embodiment, the operation of gas jet assembly 100A, and thus the angular and longitudinal positions of gas injector 130A, is based on information supplied by an operator. Advantageously, computer 400 moves gas injector 130A automatically and without manual intervention.

Recall that in the prior art, the operator physically had to go to the positioning device and turn micrometer knobs by hand to adjust the nozzle of the gas jet assembly. This required the operator to leave the reactor controls temporarily unattended, which was undesirable. Further, turning the micrometer knobs by hand was relatively labor intensive and carried an inherent chance of operator error in micrometer knob adjustment.

In contrast, use of gas jet assembly 100A in accordance with the present invention eliminates the prior art requirement of manually adjusting micrometer knobs. As a result, labor is saved and operator error is reduced. This, in turn, results in a lower overall operating cost of reactor 133A. Further, gas jet assembly 100A precisely controls the longitudinal and angular positions of gas injector 130A. Accordingly, the direction and position at which process gas is introduced into reactor 133A is precisely controlled.

Figure 5A:
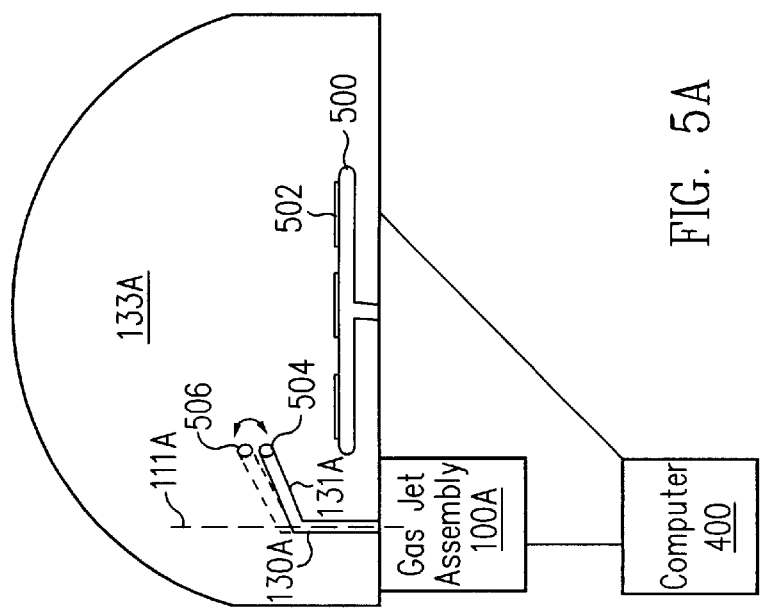
Figure 6A:
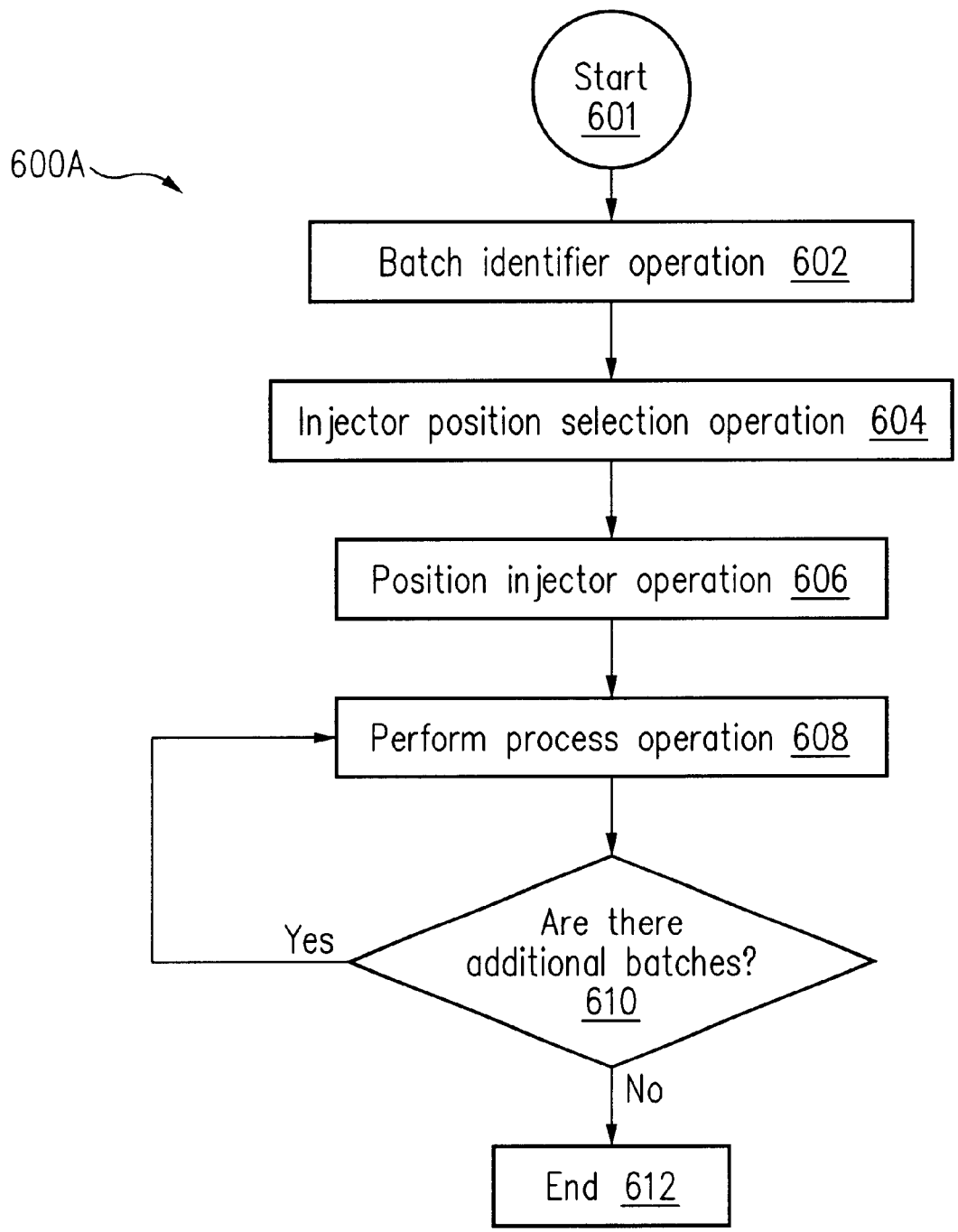
FIGS. 6A and 6B are block diagrams illustrating operations in a process for which the gas jet assembly is used in accordance with alternative embodiments of the present invention.
Figure 6B:
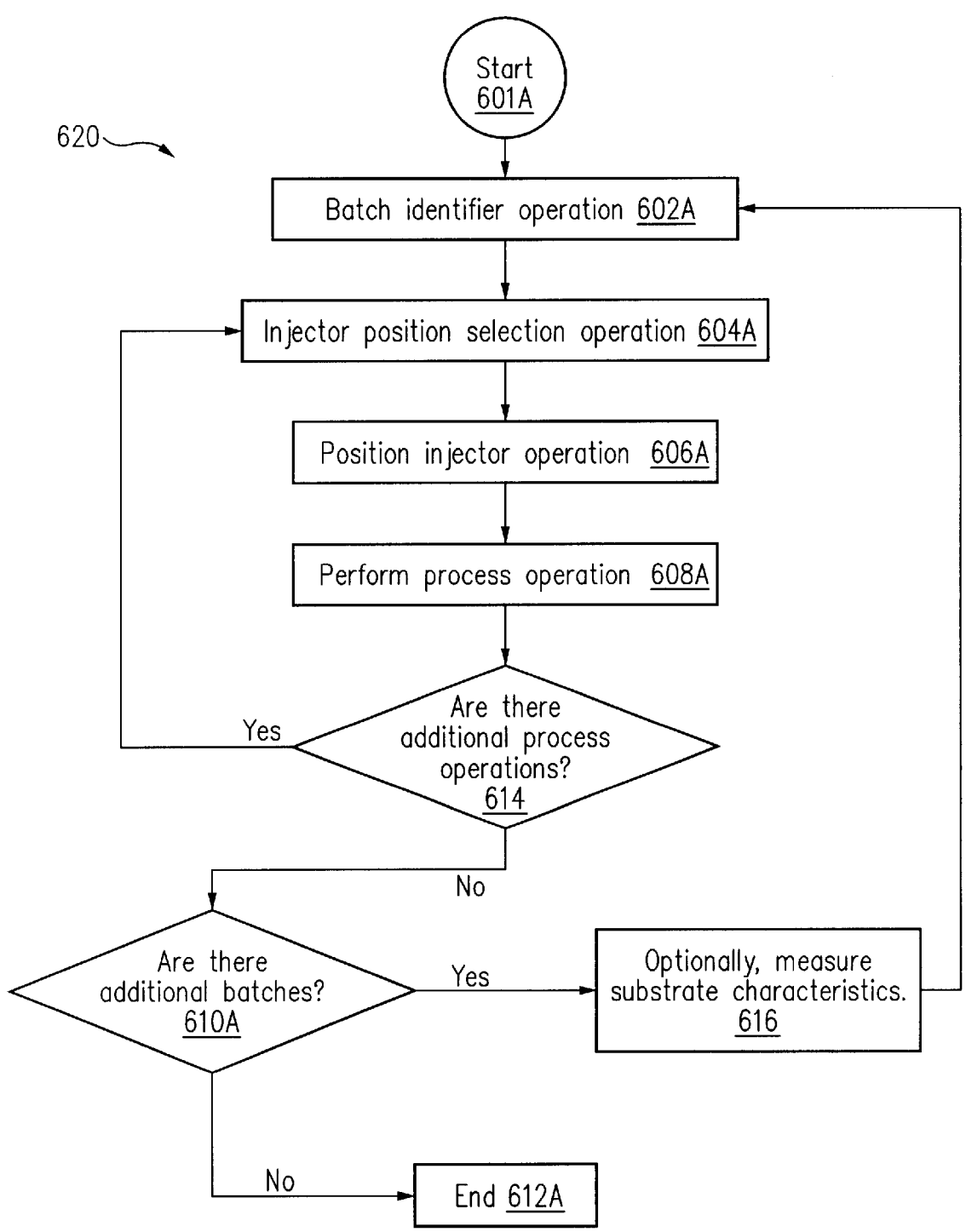

In accordance with another embodiment of the, present invention, referring now to FIGS. 5A, 5B and 6B together, a method of controlling gas injector 130A in reactor 133A with gas jet assembly 100A includes selecting a first gas injector position for a first process operation in an Injector Position Selection Operation 604A, e.g., for an etch cleaning of substrates 502. Gas injector 130A is moved automatically to the first gas injector position by gas jet assembly 100A in a Position Injector Operation 606A. The first process operation is performed in a Perform Process Operation 608A.

A determination is made that a second process operation is still to be performed at an operation 614. For example, the second process operation is a layer deposition on substrates 502. Returning to Injector Position Selection Operation 604A, a new second gas injector position for the second process operation is selected. Gas injector 130A is moved automatically to the second gas injector position by gas jet assembly 100A in Position Injector Operation 606A. The second process operation is performed in Perform Process Operation 608A.

Thus, in accordance with the present invention, gas injector 130A is moved to a gas injector position which provides the best results for each process operation. In this manner, each process operation is optimized. This is in contrast to the prior art where a single gas injector position was used for all process operations, and the single gas injector position was less than ideal depending upon the particular process operation.

In another embodiment, referring still to FIGS. 5A, 5B and 6B, a first batch of substrates 502 is processed. A determination is made that a second batch of substrates 502 is still to be processed at an Additional Batch Determination Operation 610A. The characteristics of the processed substrates 502 from the first batch are measured at a Measure Substrate Characteristics Operations 616. For example, the thickness uniformity of a layer deposited on at least one of processed substrates 502 is measured. These measured characteristics are used as the batch identifier at Batch Identifier Operation 602A. Based on these measured characteristics, a new second gas injector position for the second batch of substrates 502 is selected at Injector Position Selection Operation 604A. Gas injector 130A is moved by gas jet assembly 100A automatically to the second gas injector position without manual intervention. The second batch of substrates 502 is processed.

Advantageously, substrate characteristics from a previous batch are used to optimize the injector position for the next batch. In this manner, deviations in process conditions from batch to batch are automatically compensated for resulting in consistent substrate processing from batch to batch.

Figure 7:
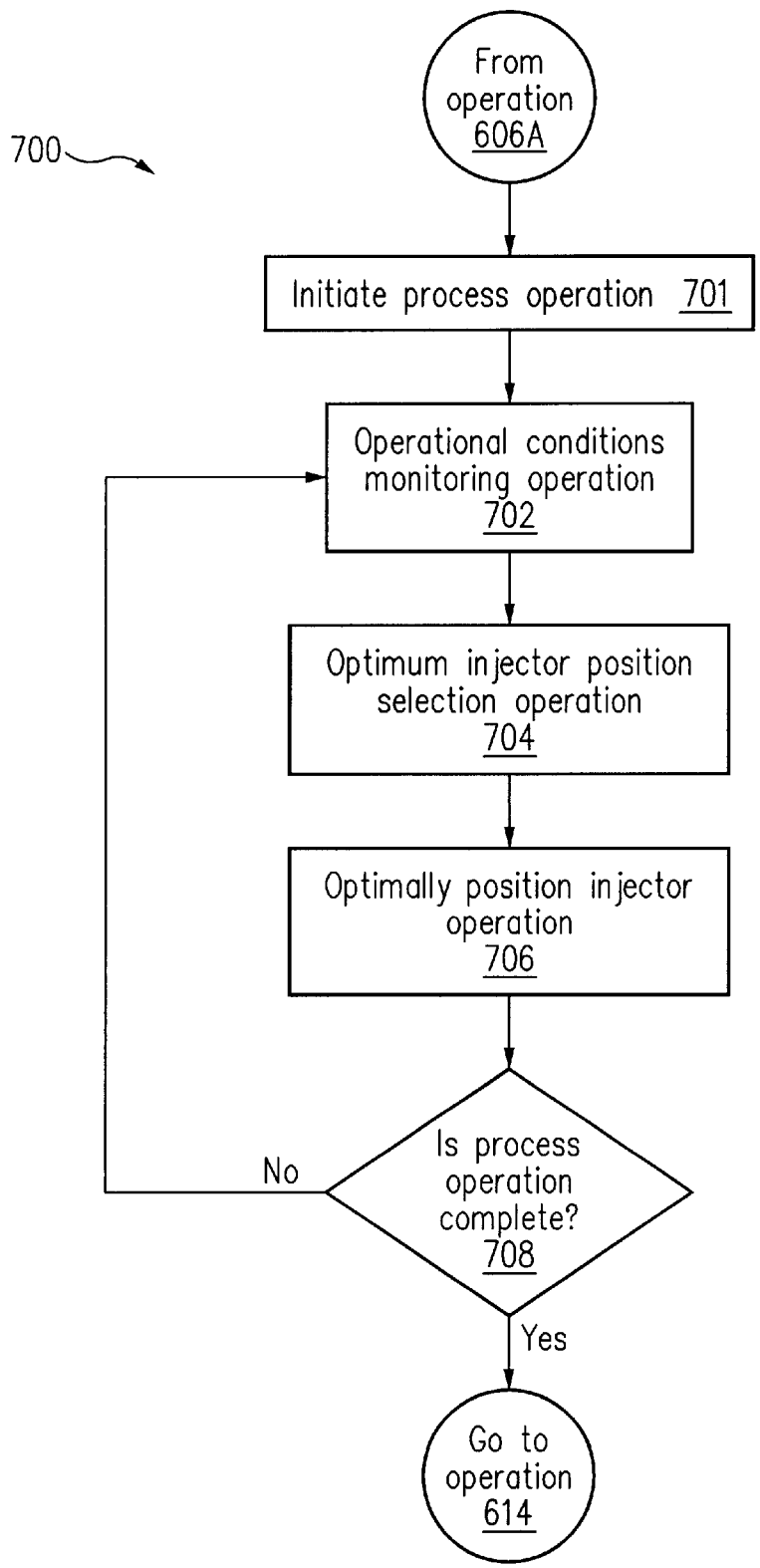
FIG. 7 is a block diagram illustrating operations in a process for which the gas jet assembly is used in accordance with another embodiment of the present invention.

In another embodiment, referring now to FIGS. 5A, 5B and 7 together, a process operation is initiated at an Initiate Process Operation 701. The operational conditions of reactor 133A are monitored during the process operation in an Operational Conditions Monitoring Operation 702. The optimum gas injector position is determined based on the monitored operational conditions in an Optimum Injector Position Selection Operation 704. Gas jet assembly 100A moves gas injector 130A to the optimum gas injector position in an Optimally Position Injector Operation 706. Operations 702, 704, and 706 are repeated until the process operation is complete. More particularly, the operational conditions in reactor 133A are continuously monitored, and gas injector 130A is continuously moved to the optimum gas injector position during the entire process operation.

Thus, in accordance with the present invention, the gas injector position is responsive to the operational conditions existing in reactor 133A at all times. In this manner, instantaneous deviations in operational conditions are automatically compensated for resulting in the most optimum processing of substrates 502.

Figure 8A:
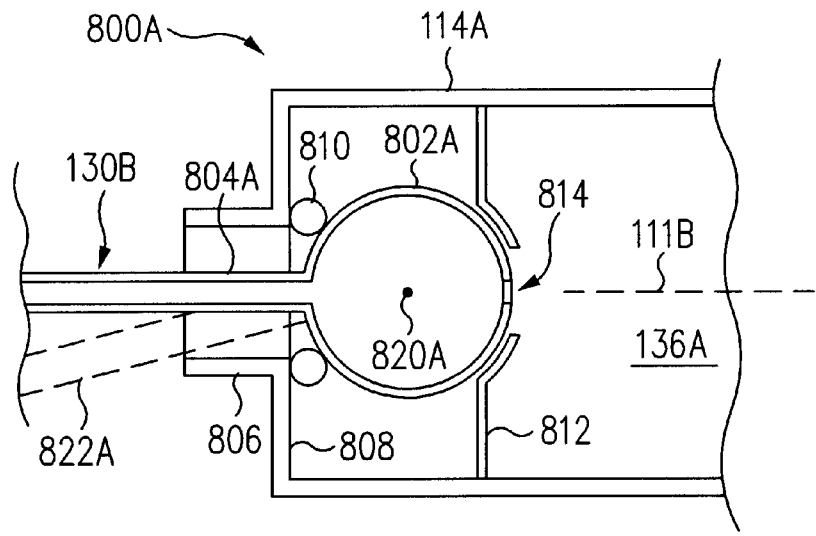
FIGS. 8A and 8B are cross-sectional views of gas jet assemblies having pivotable injectors in accordance with alternative embodiments of the present invention.
Figure 8B:
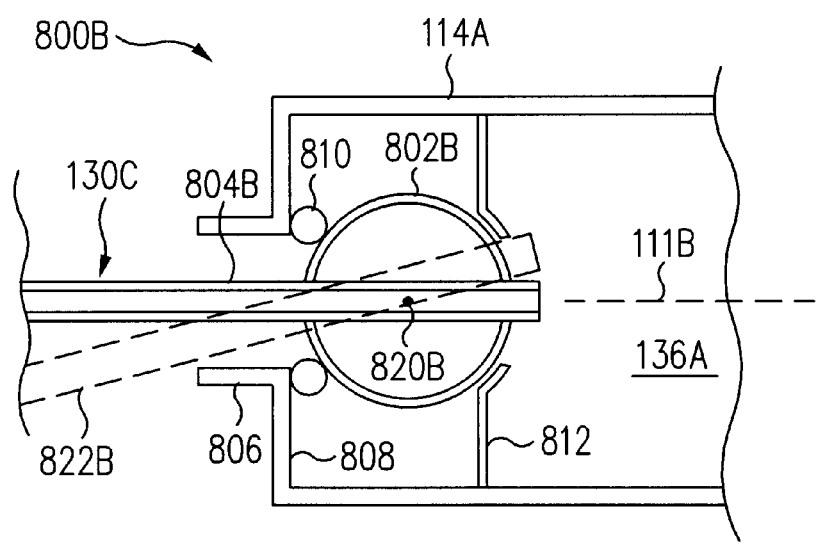
Figure 9A:
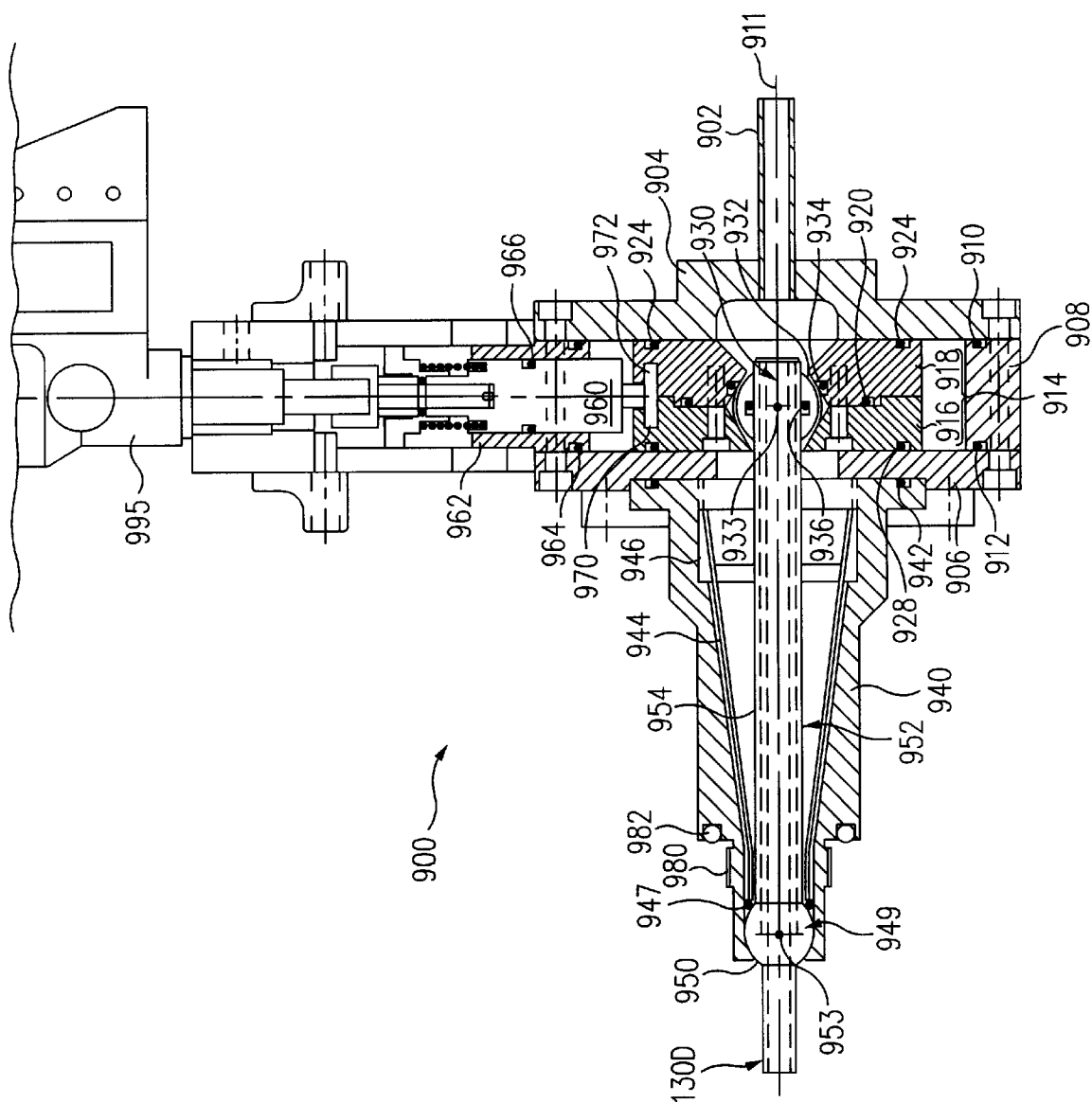
FIGS. 9A and 9B are cross-sectional views of a pivotable injector in accordance with an alternative embodiment of the present invention.

In other embodiments, referring now to FIGS. 8A, 8B and 9A together, gas jet assemblies 800A, 800B, 900 include pivotable injectors 130B, 130C, 130D, respectively. By having the ability to pivot injectors 130B, 130C, 130D, greater control of process gas introduction into the reactor is obtained. Further, injectors 130B, 130C, 130D, are formed of a nonmetallic material such as quartz, graphite or ceramic. By forming injectors 130B, 130C, 130D of nonmetallic material, contamination from the metal of nozzles of the prior art is avoided.

In the prior art, the gas jet assembly imparted significant stress on the gas nozzle and so the gas nozzle was formed of metal to avoid cracking and failure of the gas nozzle. Recall that shielding was used in an attempt to avoid etching of the metal nozzle and thus to avoid metal contamination of the deposited layer. However, etching of the metal nozzle was still observed depending upon the particular process performed.

Advantageously, injectors 130B, 130C, 130D are pivotable and thus provide flexibility in controlling process gas flow characteristics into and through the reactor. Yet, injectors 130B, 130C, 130D are formed of a nonmetallic material thus avoiding metal contamination of the prior art. In addition, by forming injectors 130B, 130C, 130D of an infrared transparent material as those of skill in the art will understand, e.g., of quartz, heating of injectors 130B, 130C, 130D is minimized thus minimizing deposit formation on injectors 130B, 130C, 130D.

Figure 1:
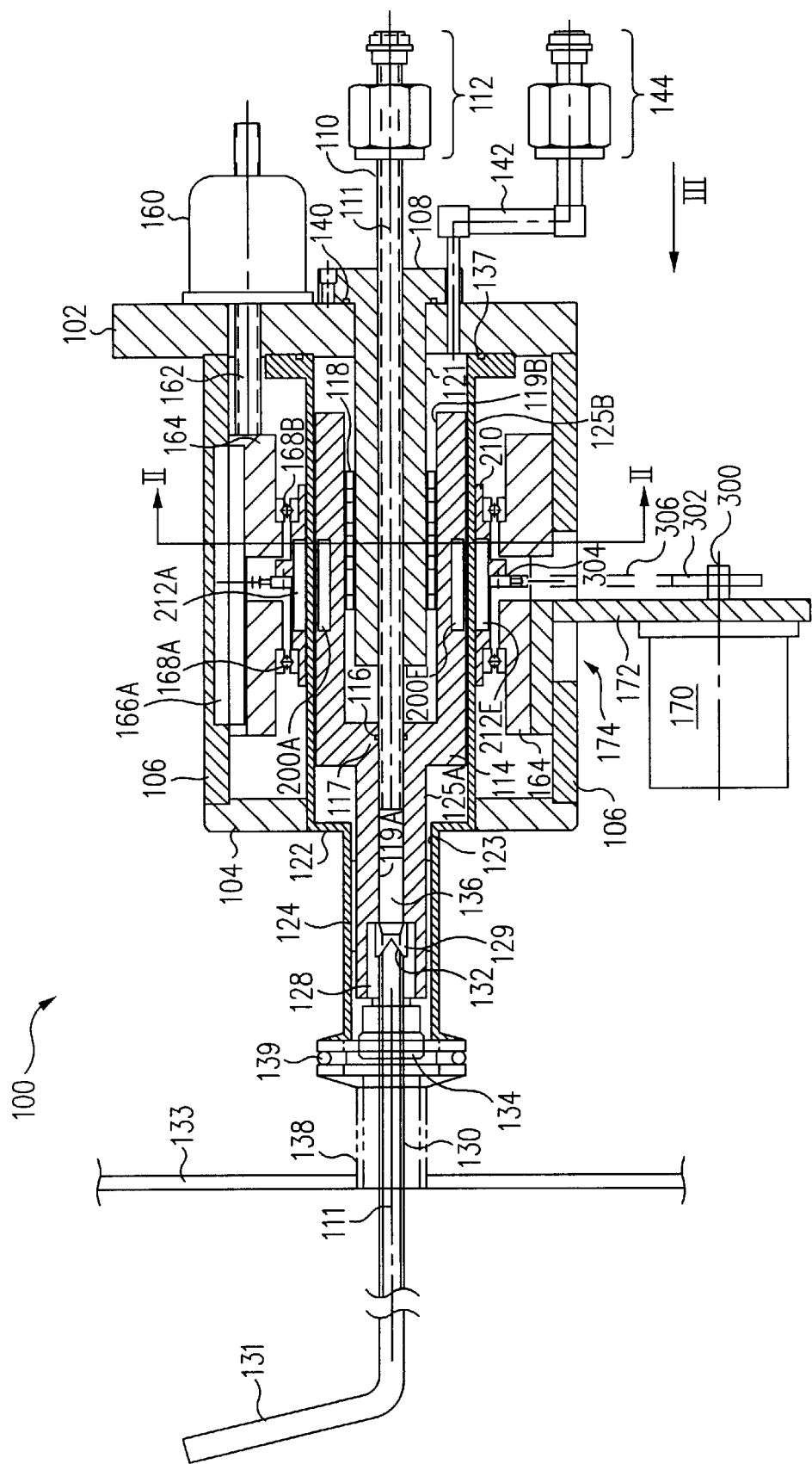
FIG. 1 is side view, partially in cross-section, of a gas jet assembly in accordance with the present invention.

More particularly, FIG. 1 is side view, partially in cross-section, of a gas jet assembly 100 in accordance with the present invention. Gas jet assembly 100 includes an inlet plate 102, an outlet plate 104, and a central housing 106, which connects inlet plate 102 to outlet plate 104. Inlet plate 102, outlet plate 104 and central housing 106 collectively form the outer housing of gas jet assembly 100.

A cylindrical shaft support 108 is fixedly attached to, and extends through, inlet plate 102. O-ring 140 forms a gas-tight seal between shaft support 108 and inlet plate 102. In one embodiment, shaft support 108 is attached to inlet plate 102 with screws.

Extending concentrically through shaft support 108 is a cylindrical hollow shaft 110, i.e., a hollow tube. In one embodiment, shaft 110 is welded to shaft support 108 to form a gas-tight seal between shaft 110 and shaft support 108. Although a separate shaft 110 and shaft support 108 are set forth, in light of this disclosure, those of skill in the art will understand that shaft 110 and shaft support 108 can be integral, i.e., can be one piece and not separate pieces connected together.

At one end, shaft 110 is provided with a conventional process gas fitting 112 with which a gas-tight seal is formed with a process gas line (not shown). Shaft 110 has a common longitudinal axis 111 with a gas injector 130.

A second end of shaft 110 is located within a slider 114. A first inner cylindrical surface 119A of slider 114 is concentric with shaft 110. An O-ring 116 is located in an O-ring channel 117 of inner cylindrical surface 119A to form a gas-tight seal between shaft 110 and slider 114. Although O-ring 116 is set forth, those of skill in the art will understand that other seals besides O-rings can be used.

Slider 114 and, more particularly, a second inner cylindrical surface 119B of slider 114, is movably supported on an outer cylindrical surface 121 of shaft support 108 by a first bearing 118. Inner cylindrical surface 119B is concentric with shaft support 108 and shaft 110. Slider 114 is further supported on an inner cylindrical surface 123 of an inner housing 122 by a second bearing 124. More particularly, a first outer cylindrical surface 125A of slider 114 is moveably supported on inner cylindrical surface 123 of inner housing 122 by bearing 124. Inner cylindrical surface 123 of inner housing 122 and outer cylindrical surface 125A of slider 114 are concentric with shaft 110 and have a common longitudinal axis 111 with shaft 110.

As discussed in greater detail below, bearings 118, 124 allow slider 114 to rotate about shaft support 108. Unless otherwise indicated, rotation refers to rotation around longitudinal axis 111 in a plane perpendicular to longitudinal axis 111. Bearings 118, 124 also allow slider 114 to move in the longitudinal direction. As used herein, the longitudinal direction is the direction parallel to longitudinal axis 111 and longitudinal motion is motion in the longitudinal direction. Although the term parallel is used herein, those of skill in the art will understand that parallel means parallel to within manufacturing tolerances, i.e., that although various items may be described as parallel, the items may not be exactly parallel but only substantially parallel.

Slider 114 includes an injector coupling 128, which couples gas injector 130 to slider 114. Injector 130 is a hollow tube, typically quartz, having a V-shaped end 132. V-shaped end 132 is typically formed by grinding down, from opposing sides, the edge of a cylindrical end of injector 130. V-shaped end 132 is a locking feature, which insures that injector 130 is properly positioned in injector coupling 128. Injector coupling 128 has a V-shaped feature 129 complimentary to V-shaped end 132 of injector 130. Injector 130 extends from injector coupling 128 through a conventional seal 134 mounted to inner housing 122.

During use, process gas is supplied to shaft 110 through fitting 112. The process gas flows from shaft 110 through slider 114 and into injector 130. More particularly, the process gas flows through shaft 110 and into an interior cavity 136 of slider 114. From interior cavity 136, the process gas flows through injector coupling 128 and into injector 130. Injector 130 passes through a port 138 of a reactor 133 and directs the process gas into reactor 133 through a tip 131 of injector 130, which in this embodiment is a bent tip. Although a particular injector is described and illustrated, i.e., injector 130, in light of this disclosure, those of skill in the art will understand that a variety of injectors can be used. For example, injector 130 is curved, has a plurality of bends and/or is straight.

Generally, injector 130 is moved by moving slider 114 relative to shaft 110. Since slider 114, and hence O-ring 116, move relative to shaft 110, leakage of process gas past O-ring 116 is possible. Since the process gas is often hazardous to human health and the environment, it is important that any leakage of process gas past O-ring 116 be avoided. Further, in the event that any process gas does leak past O-ring 116, this process gas must be captured and prevented from escaping to the ambient environment.

Of importance, slider 114 is located within inner housing 122. Inner housing 122 forms a gas-tight enclosure around slider 114 and this enclosure captures any process gas which leaks past O-ring 116. To insure that this enclosure is gas-tight, an O-ring 137 forms a seal between inner housing 122 and inlet plate 102 and seal 134 forms a seal between inner housing 122 and injector 130. Thus, any process gas which leaks past O-ring 116 is captured inside inner housing 122.

However, to prevent any process gas from leaking past O-ring 116 in the first place, a purge line 142 is plumbed into the enclosure formed by inner housing 122. Purge line 142 has a gas fitting 144 on a first end to which a gas-tight connection is formed with an inert gas line (not shown). A second end of purge line 142 extends through inlet plate 102 and into the enclosure formed by inner housing 122. In one embodiment, purge line 142 is welded to inlet plate 102 to form a gas-tight seal between purge line 142 and inlet plate 102.

During use, an inert gas such as nitrogen is provided through purge line 142 and into inner housing 122. By providing the inert gas at a pressure greater than the pressure of the process gas, any leakage past O-ring 116 is inert gas leakage into interior cavity 136 and is not process gas leakage out of interior cavity 136. Further, by providing the inert gas at a pressure greater than the pressure inside reactor 133, any leakage past seal 134 is inert gas leakage into reactor 133 and is not process gas leakage out of reactor 133. An O-ring 139 is provided between port 138 and inner housing 122 to prevent any direct leakage between reactor 133 and the ambient environment. Thus, process gas leakage and the associated hazards are avoided.

Figure 2:
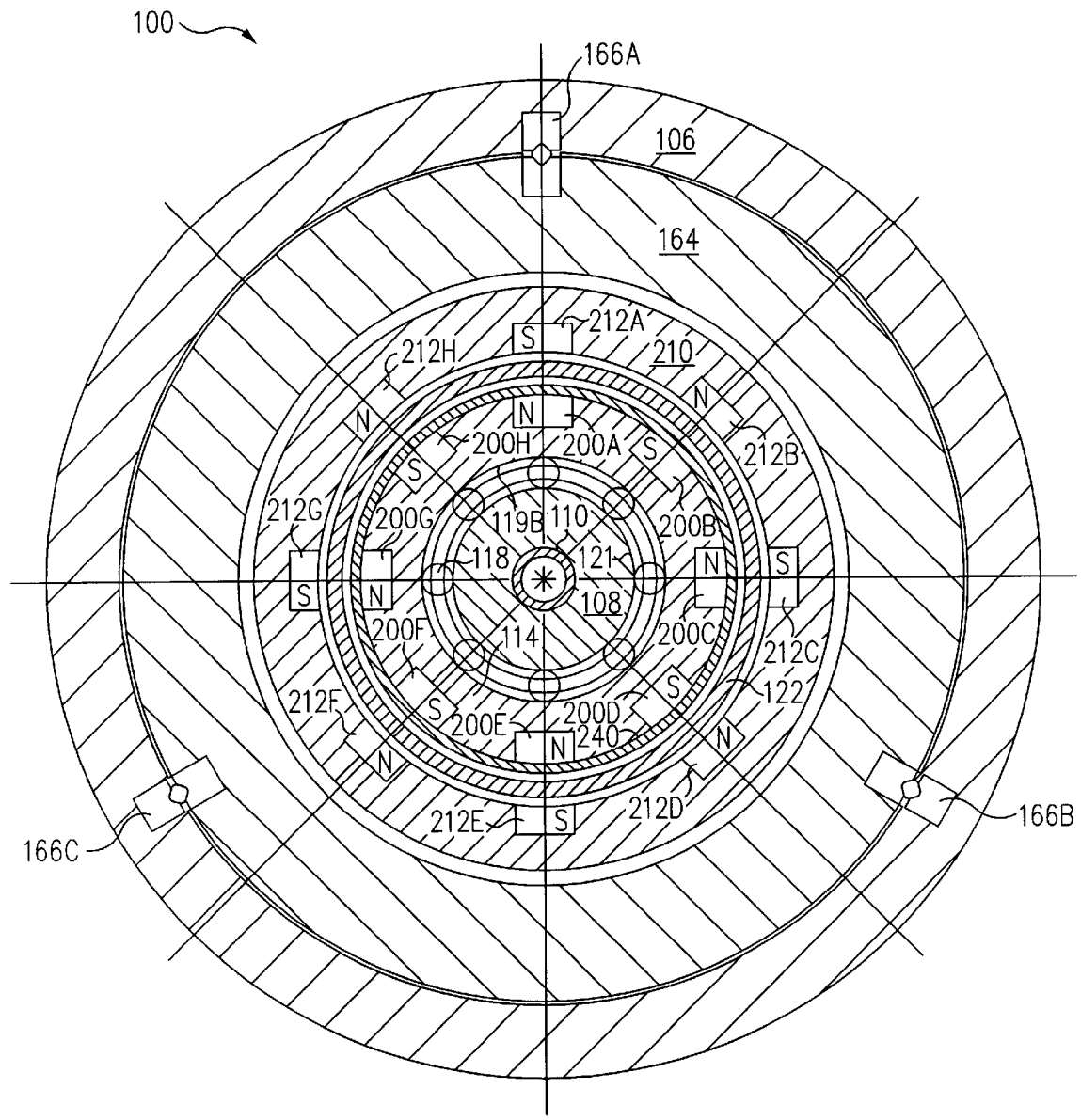
FIG. 2 is a cross-sectional view of the gas jet assembly along the line II—II of FIG. 1.

FIG. 2 is a cross-sectional view of gas jet assembly 100 along the line II—II of FIG. 1. As shown in FIG. 2, shaft 110 extends concentrically through shaft support 108. Inner cylindrical surface 119B of slider 114 is supported on outer cylindrical surface 121 of shaft support 108 by bearing 118.

Referring now to FIGS. 1 and 2 together, imbedded in slider 114 are a plurality of inner magnets 200A–200H. In particular, eight inner magnets 200A–200H, collectively referred to as inner magnets 200, are imbedded in slider 114. Inner magnets 200 are completely enclosed within slider 114. Alternatively, surfaces of inner magnets 200 are exposed and are flush with, recessed from or extended from a second outer cylindrical surface 125B of slider 114. Further, to avoid exposure of inner magnets 200 to process gas, a sleeve 240, e.g., made of stainless-steel, encloses slider 114 including inner magnets 200.

Inner magnets 200 are arranged so that each of inner magnets 200 has a magnetic polarity opposite that of the adjacent magnets of inner magnets 200. For example, inner magnet 200A is aligned with its north pole, south pole towards outlet plate 104, inlet plate 102, respectively. Conversely, inner magnets 200B, 200H are both aligned with their south poles, north poles towards outlet plate 104, inlet plate 102, respectively.

A coupling ring 210 adjacent an outer surface of inner housing 122 includes a plurality of outer magnets 212A–212H. In particular, eight outer magnets 212A–212H, collectively referred to as outer magnets 212, are imbedded in coupling ring 210. Outer magnets 212 are completely enclosed within coupling ring 210. Alternatively, surfaces of outer magnets 212 are exposed and are flush with, recessed from or extended from the inner surface of coupling ring 210.

Each of outer magnets 212 is located adjacent, and has a magnetic polarity opposite that of a different inner magnet 200, sometimes called a corresponding inner magnet. For example, inner magnet 200A is aligned with its north pole, south pole towards outlet plate 104, inlet plate 102, respectively, and the corresponding outer magnet 212A is aligned with its south pole, north pole towards outlet plate 104, inlet plate 102, respectively.

Since opposite poles attract, inner magnet 200A is magnetically coupled to outer magnet 212A. More generally, each outer magnet 212A–212H is magnetically coupled to its corresponding inner magnet 200A–200H. Since outer magnets 212 are imbedded in coupling ring 210 and inner magnets 200 are imbedded in slider 114, coupling ring 210 is magnetically coupled to slider 114 through inner housing 122. Accordingly, motion of coupling ring 210, e.g., rotation or longitudinal motion, produces an equal motion of slider 114.

Although eight outer magnets 212 and eight corresponding inner magnets 200 are set forth, in light of this disclosure, it is understood that more or less than eight outer magnets 212 and corresponding inner magnets 200 can be used.

Advantageously, slider 114 is coupled to coupling ring 210 without physically passing a structure through inner housing 122. In this manner, the integrity and dependability of inner housing 122 as a gas-tight enclosure is insured.

Referring again to FIG. 1, the longitudinal position, i.e., the position along longitudinal axis 111, of coupling ring 210 is controlled by a stepper motor 160. Stepper motor 160 is attached to inlet plate 102. A piston 162 extends from stepper motor 160 and through inlet plate 102. Stepper motor 160 controls the longitudinal motion of piston 162, and more particularly, controls the retraction and extension of piston 162 into and out of stepper motor 160.

Piston 162 is connected to a linear ring 164. Linear ring 164 is connected to central housing 106 by linear bearings 166A, 166B, 166C, collectively referred to as linear bearings 166. As shown in FIG. 2, three linear bearings 166A, 166B, 166C are used although, in light of this disclosure, it is understood that more or less than three linear bearings can be used. Linear bearings 166 allow longitudinal motion of linear ring 164 but prevent linear ring 164 from rotating. Thus, by controlling the longitudinal motion and the longitudinal position of piston 162, stepper motor 160 controls the longitudinal motion and the longitudinal position of linear ring 164.

Longitudinal motion of linear ring 164 produces an equal longitudinal motion of slider 114. In particular, referring to FIGS. 1 and 2 together, linear ring 164 is connected to coupling ring 210 by bearings 168A, 168B such that any longitudinal motion of linear ring 164 causes an equal longitudinal motion of coupling ring 210. As set forth above, coupling ring 210 is magnetically coupled to slider 114 such that any longitudinal motion of coupling ring 210 causes an equal longitudinal motion of slider 114.

Since injector 130 is coupled to slider 114, any longitudinal motion of slider 114 causes an equal longitudinal motion of injector 130. Accordingly, stepper motor 160 is coupled to injector 130. In the above manner, stepper motor 160 controls the longitudinal motion and longitudinal position of injector 130 and thus the location at which process gas is introduced into reactor 133.

Recall that in the prior art, the nozzle of the gas jet assembly was pivotable relative to the reactor. However, the gas jet assembly did not allow the nozzle to be moved in and out of the reactor. This limited the ability to control the location within the reactor at which the process gas was introduced, and hence, limited the ability to control the process.

In contrast, the longitudinal position of injector 130, and thus the location at which process gas is introduced into reactor 133, is readily controlled by gas jet assembly 100. Accordingly, greater process control is obtained using gas jet assembly 100 than in the prior art.

The angular position around longitudinal axis 111 and in a plane perpendicular to longitudinal axis 111 (hereinafter the angular position) of coupling ring 210, and hence injector 130, is controlled by a stepper motor 170. Stepper motor 170 is mounted to a bracket 172 attached to linear ring 164. Thus, longitudinal motion of linear ring 164 causes an equal longitudinal motion of stepper motor 170. Bracket 172 extends through a slot 174 in central housing 106. Slot 174 has a width sufficient to allow free longitudinal motion of bracket 172 in slot 174.

Figure 3:
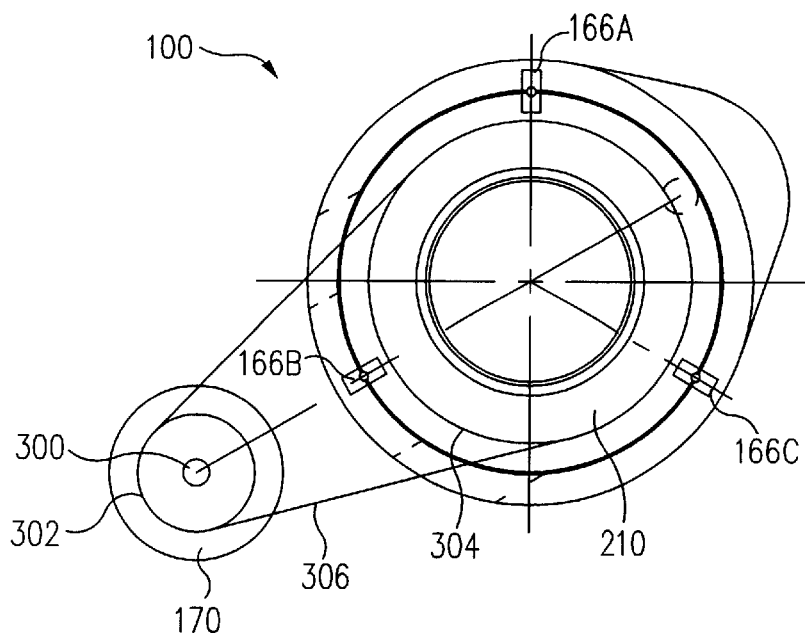
FIG. 3 is a partial view, taken along the line III of FIG. 1, of the gas jet assembly illustrating the mechanism by which a stepper motor controls the angular position of a coupling ring.

FIG. 3 is a partial view, taken along the line III of FIG. 1, of gas jet assembly 100 illustrating the mechanism by which stepper motor 170 controls the angular position of coupling ring 210. Referring to FIG. 3, stepper motor 170 controls the rotation and angular position of a spindle 300 extending from stepper motor 170. A stepper motor sprocket 302 on spindle 300 is attached to spindle 300. Alternatively, stepper motor sprocket 302 is integral with spindle 300, i.e., spindle 300 and stepper motor sprocket 302 are one piece and not separate pieces connected together. A coupling ring sprocket 304 on coupling ring 210 is attached to, or is integral with, coupling ring 210. Stepper motor sprocket 302 is connected to coupling ring sprocket 304 by a belt 306. Typically, belt 306 is a chain and sprockets 302, 304 have teeth which mesh with the links of belt 306.

Referring again to FIG. 1, bearings 168A, 168B allow coupling ring 210 to rotate. This rotation is controlled by stepper motor 170, which rotates spindle 300, stepper motor sprocket 302, and coupling ring 210 via belt 306.

As set forth above, coupling ring 210 is magnetically coupled to slider 114. Thus, rotation of coupling ring 210 causes an equal rotation of slider 114. Since slider 114 is coupled to injector 130, rotation of slider 114 causes injector 130 to rotate. Accordingly, stepper motor 170 is coupled to injector 130. In this manner, stepper motor 170 controls the rotation (clockwise and counterclockwise) and angular position of injector 130.

Injector 130 includes bent tip 131, which extends at an angle away from longitudinal axis 111. Thus, the direction in which process gas is introduced into reactor 133 is controlled by the angular position of injector 130 and hence by stepper motor 170.

Advantageously, gas jet assembly 100 controls both the angular and longitudinal positions of injector 130. As discussed further below, the operation of gas jet assembly 100, and thus the angular and longitudinal positions of injector 130, is based on information supplied by the operator.

Recall that in the prior art, the operator physically had to go to the positioning device to turn micrometer knobs by hand to adjust the nozzle of the gas jet assembly. This required the operator to leave the reactor controls temporarily unattended, which was undesirable. Further, turning the micrometer knobs by hand was relatively labor intensive and carried an inherent chance of operator error in micrometer knob adjustment.

In contrast, use of gas jet assembly 100 in accordance with the present invention eliminates the prior art requirement of manually adjusting micrometer knobs. As a result, labor is saved and operator error is reduced. This, in turn, results in a lower overall operating cost of reactor 133.

Further, stepper motors 160, 170 precisely control the longitudinal and angular positions, respectively, of injector 130. For example, the longitudinal position of injector 130 is controlled to within ±0.001 inches (0.025 mm) and the angular position of injector 130A is controlled to within ±0°,0',1". Accordingly, the direction and position at which process gas is introduced into reactor 133 is precisely controlled.

In an alternative embodiment, injector 130 is pivotably mounted to slider 114. FIG. 8A is a cross-sectional view of a gas jet assembly 800A having a pivotable injector 130B in accordance with this embodiment of the present invention. Referring now to FIG. 8A, injector 130B includes a spherical ball portion 802A and a tube portion 804A extending from ball portion 802A. In this embodiment, ball portion 802A is integral with tube portion 804A, i.e., ball portion 802A and tube portion 804A are one piece and not separate pieces connected together.

Slider 114A includes a flange 806 having an annulus 808 perpendicular to a longitudinal axis 111B of slider 114A. An O-ring 810 forms a seal between annulus 808 and ball portion 802A of injector 130B. More particularly, ball portion 802A is pressed into contact against O-ring 810 towards annulus 808 by a compression ring 812. For example, compression ring 812 is threaded to slider 114A such that the force exerted by compression ring 812 on ball section 802A is readily controlled by rotating compression ring 812.

Ball portion 802A includes an aperture 814. During use, process gas flows from interior cavity 136A, through aperture 814, through ball portion 802A, through tube portion 804A and into the reactor. O-ring 810 insures that the process gas flows through injector 130B and not between injector 130B and slider 114A.

FIG. 8B is a cross-sectional view of a gas jet assembly 800B having a pivotable injector 130C in accordance with another embodiment of the present invention. Injector 130C of FIG. 8B is substantially similar to injector 130B of FIG. 8A except that a ball portion 802B and a tube portion 804B of injector 130C are separate pieces connected together. More particularly, tube portion 804B extends through ball portion 802B. In one embodiment, tube portion 804B is connected to ball portion 802B through a fiction fit.

Advantageously, ball portion 802B can be formed of a material, e.g., stainless-steel, having greater mechanical strength than tube portion 804B, e.g., quartz. By forming ball portion 802B of a high-strength material, cracking and failure of ball portion 802B from force exerted by compression ring 812 is avoided. Alternatively, ball portion 802B is formed of the same material as tube portion 804B.

During use, process gas flows from interior cavity 136A, enters and flows through tube portion 804B of injector 130C and into the reactor. O-ring 810 insures that the process gas flows through injector 130C and not between injector 130C and slider 114A.

Referring now to FIGS. 8A and 8B together, injectors 130B, 130C are readily pivotable. More particularly, ball portions 802A, 802B, hereinafter collectively referred to as ball portion 802 for simplicity of discussion, are readily slidable against O-ring 810 and compression ring 812. For example, tube portions 804A, 804B, hereinafter collectively referred to as tube portion 804 for simplicity of discussion, are grasped and move to slide ball portion 802 against O-ring 810 and compression ring 812. In this manner, injectors 130B, 130C are pivoted around a pivot point 820A, 820B located within ball portions 802A, 802B, respectively. For example, injectors 130B, 130C are pivoted to locations 822A, 822B (shown in dashed lines) such that injectors 130B, 130C, respectively, are at an angle to longitudinal axis 111B of slider 114A.

Figure 9B:
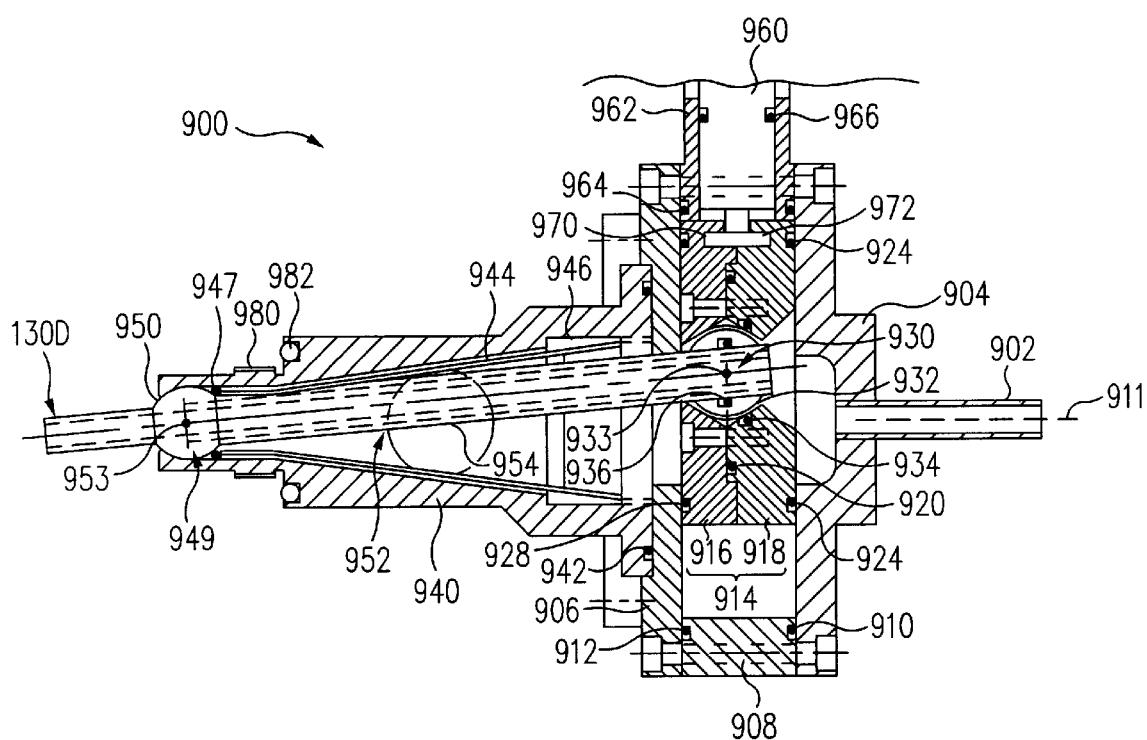

FIGS. 9A and 9B are cross-sectional views of a gas jet assembly 900 having a pivotable nonmetallic injector 130D in accordance with an alternative embodiment of the present invention. Referring now to FIG. 9A, gas jet assembly 900 includes an inlet plate 904 and an outlet plate 906. A cylindrical hollow shaft 902, i.e., a hollow tube, extends through inlet plate 904 and is attached to inlet plate 904. For example, shaft 902 is welded to inlet plate 904. Shaft 902 is connected with a process gas line (not shown).

Inlet plate 904 and outlet plate 906 are connected together by a central housing 908, for example, with screws. An O-ring 910 forms a seal between inlet plate 904 and central housing 908. Similarly, an O-ring 912 forms a seal between outlet plate 906 and central housing 908.

Sandwiched between inlet plate 904 and outlet plate 906 is a slider 914. Slider 914 includes a first half 916 and a second half 918 connected together, for example, with screws. An O-ring 920 forms a seal between first half 916 and second half 918. Further, an O-ring 924 forms a seal between second half 918 and inlet plate 904. Similarly, an O-ring 928 forms a seal between first half 916 and outlet plate 906.

Slider 914 defines a pocket 930 within slider 914. Located within pocket 930 is a spherical ball 932, e.g., made of stainless-steel. An O-ring 934 forms a seal between second half 918 and ball 932.

Attached to outlet plate 906, opposite slider 914, is an injector housing 940. An O-ring 942 forms a seal between housing 940 and outlet plate 906. At one end of housing 940, housing 940, in combination with a tapered seal ring 944, defines a pocket 949. Located within pocket 949 is a ball 950 of an injector sleeve 952. Seal ring 944 has a threaded portion 946 which is threaded to housing 940. Seal ring 944 presses an O-ring 947 against ball 950 and thus securely supports ball 950 within pocket 949 of housing 940. As discussed in greater detail below, ball 950 is readily slidable against housing 940 and O-ring 947. O-ring 947 forms a seal between ball 950 and housing 940.

Extending from ball 950 is cylindrical hollow shaft 954, i.e., a hollow tube, of injector sleeve 952. In this embodiment, shaft 954 and ball 950 are integral. In accordance with this embodiment, injector sleeve 952 is made of stainless-steel although in other embodiments injector sleeve 952 is formed of other materials.

In accordance with this embodiment, injector 130D is formed of a nonmetallic material such as quartz, graphite or ceramic. Injector 130D is a straight tube which is inserted inside of injector sleeve 952, and more particularly, extends through ball 950 and shaft 954 and, generally, injector sleeve 952. Shaft 954 of injector sleeve 952 extends through ball 932. An O-ring 936 forms a seal between ball 932 and shaft 954 of injector sleeve 952.

A piston 960 is movably supported within a piston housing 962. Piston housing 962 is connected to inlet plate 904 and outlet plate 906. An O-ring 964 forms a seal between piston housing 962 and inlet plate 904, outlet plate 906. Further, an O-ring 966 forms a seal between piston 916 and piston housing 962 although it is understood that more than one O-ring can be used.

During use, piston 960 is moved within, and relative to, piston housing 962. For example, piston 960 is moved by adjusting a micrometer 995 attached to piston 960, as those of skill in the art will understand. Piston 960 includes a head 970 within a T-channel 972 of slider 914. Generally, piston 960 is coupled to slider 914. Accordingly, motion of piston 960 causes an equal motion of slider 114. Since ball 932 is supported in pocket 930 of slider 914, motion of slider 914 causes an equal motion of ball 932. Since shaft 954 extends through, and is supported in, ball 932, motion of ball 932 causes pivoting of injector sleeve 952 around ball 932 and, more particularly, around a pivot point 933 located within ball 932.

Since ball 950 of injector sleeve 952 is supported in pocket 949 of housing 940, motion of ball 932 also causes injector sleeve 952 to pivot around ball 950, and, more particularly, to pivot around a pivot point 953 located within ball 950. Since injector 130D is inserted into injector sleeve 952, injector 130D is similarly pivoted around ball 950 and pivot point 953 and around ball 932 and pivot point 933. Generally, injector 130D is pivoted relative to housing 940 and is also pivoted relative to slider 914.

As set forth above, injector 130D is pivotably coupled to housing 940 and is also pivotably coupled to slider 914. More generally, piston 960 is coupled to injector 130D. By controlling the motion and position of piston 960, pivoting of injector 130D is readily controlled. FIG. 9B illustrates pivoting of injector 130D such that injector 130D is at an angle to longitudinal axis 911 of shaft 902.

During use, process gas is supplied to shaft 902. The process gas flows from shaft 902 through inlet plate 904 and into injector 130D. Housing 940 includes a threaded cylindrical surface 980, which is threaded to a conventional gas ring (not shown), as those of skill in the art will understand. An O-ring 982 forms a seal between housing 940 and the gas ring. Accordingly, injector 130D directs the process gas through the gas ring and into the reactor.

Figure 9C:
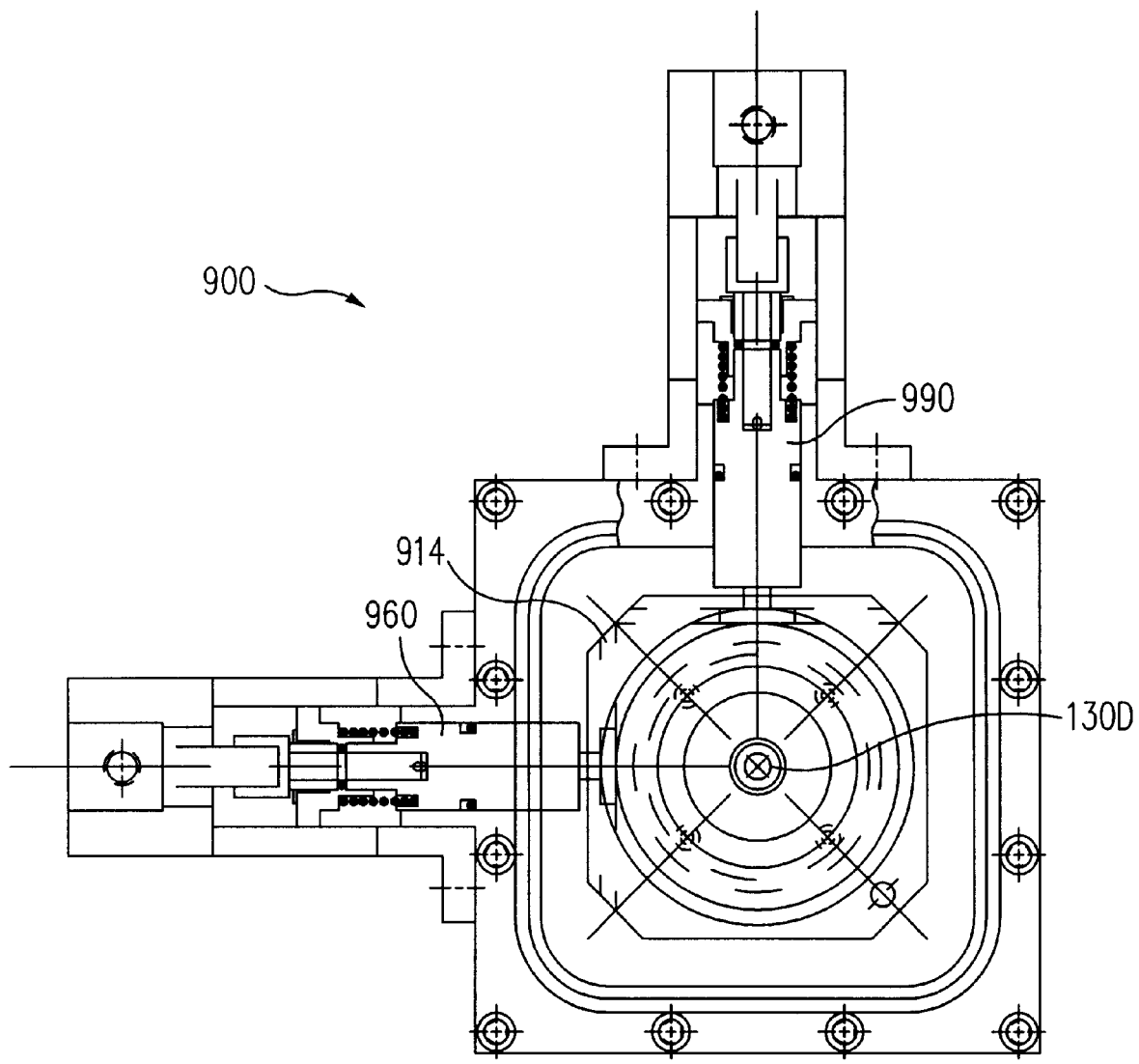
FIG. 9C is a perspective view, partially cutaway, of the pivotable injector of FIGS. 9A and 9B.

FIG. 9C is a front perspective view, partially cutaway, of gas jet assembly 900 in accordance with this embodiment of the present invention. Referring to FIGS. 9A and 9C together, gas jet assembly 900 includes piston 960, e.g., a first piston, and a piston 990, e.g., a second piston, perpendicular to piston 960. Piston 990 is substantially similar to, and operates in the same manner as, piston 960 and so is not described in detail to avoid detracting from the principals of the invention. Generally, piston 960 moves slider 914 in the horizontal direction whereas piston 990 moves slider 914 in the vertical direction. Stated another way, piston 960 controls horizontal pivoting of injector 130D whereas piston 990 controls vertical pivoting of injector 130D.

Advantageously, referring now to FIGS. 8A, 8B and 9A together, by having the ability to pivot injectors 130B, 130C, 130D, control of process gas introduction into the reactor is obtained. Further, injectors 130B, 130C, 130D are formed of a nonmetallic material such as quartz, graphite or ceramic. By forming injectors 130B, 130C, 130D of a nonmetallic material, contamination from the metal of nozzles of the prior art is avoided.

In the prior art, the gas jet assembly imparted significant stress on the gas nozzle and so the gas nozzle was formed of metal to avoid cracking and failure of the gas nozzle. Recall that shielding was used in an attempt to avoid etching of the metal nozzle and thus to avoid metal contamination of the deposited layer. However, etching of the metal nozzle was still observed depending upon the particular process performed.

Advantageously, injectors 130B, 130C, 130D are pivotable and thus provide flexibility in controlling process gas flow characteristics into and through the reactor. Yet, injectors 130B, 130C, 130D are formed of a nonmetallic material thus avoiding metal contamination of the prior art. In addition, by forming injectors 130B, 130C, 130D of an infrared transparent material as those of skill in the art will understand, e.g., of quartz, heating of injectors 130B, 130C, 130D is minimized thus minimizing deposit formation on injectors 130B, 130C, 130D.

Referring again to FIG. 1, to allow pivoting of injectors 130B, 130C (FIGS. 8A, 8B), seal 134 is removed. In light of this disclosure, those of skill in the art will understand that a seal can be formed between slider 114 and inner housing 122, e.g., between outer cylindrical surface 125A of slider 114 and inner housing 122, in a conventional manner to avoid leakage of the inert gas provided through purge line 142 and into inner housing 122. Alternatively, a purge gas is not provided.

Figure 4:
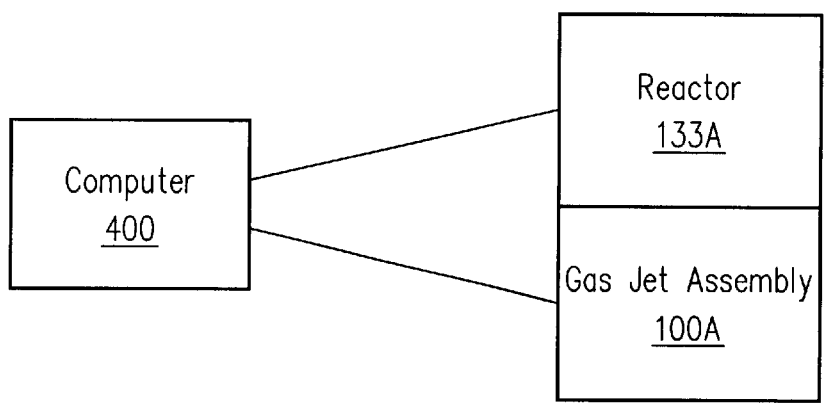
FIG. 4 is a block diagram of a system in which a single computer controls both a reactor and a gas jet assembly in accordance with the present invention.

FIG. 4 is a block diagram of a system in which a single computer 400 controls both a reactor 133A and a gas jet assembly 110A in accordance with the present invention. Computer 400 is connected to reactor 133A and gas jet assembly 100A. Computer 400 monitors various operational parameters such as pressure and substrate temperature in reactor 133A. Computer 400 also controls the operation of reactor 133A, e.g., controls the heat source, gas flow rates and loading/unloading of the substrates, according to operator specified data stored in, or accessible by, computer 400.

In one embodiment, reactor 133A is a rapid thermal processing (RTP) reactor such as that described in Moore et al., U.S. Pat. No. 5,683,518, which is herein incorporated by reference in its entirety. Gas jet assembly 100A is selected according to the type of reactor 133A as those of skill in the art will understand. However, reactor 133A is not limited to an RTP reactor but can be any one of a number of reactors, for example, is a vertical hot walled furnace reactor, a horizontal hot walled furnace reactor, a chemical vapor deposition (CVD) reactor, an etch reactor, a flat panel display (FPD) reactor or an ion implant reactor.

In one embodiment, gas jet assembly 100A is a controllable gas jet assembly such as gas jet assembly 100 of FIG. 1. In accordance with this embodiment, referring to FIGS. 1 and 4 together, computer 400 controls the operation of stepper motor 160 and thus the longitudinal position of injector 130 including tip 131. Further, computer 400 controls the operation of stepper motor 170 and thus the angular position of injector 130 including tip 131.

Computer 400 is a conventional digital computer and it is well within the skill of one skilled in the art of computer programming to program the computer to accomplish the specific task in view of this disclosure. The particular digital computer utilized, the computer operating system, and computer program language utilized are not essential to the invention and typically are determined by the process computer used with reactor 133A.

FIG. 5A is a simplified side view of reactor 133A and gas jet assembly 100A in accordance with the present invention. Reactor 133A includes a susceptor 500 which supports substrates 502, e.g., silicon wafers. Gas jet assembly 100A is mounted to reactor 133A such that a longitudinal axis 111A of injector 130A is vertical in the view of FIG. 5A, e.g., gas jet assembly 100 is rotated clockwise 90° from the view of FIG. 1. Gas jet assembly 100A is keyed to reactor 133A such that the orientation of gas jet assembly 100A with respect to reactor 133A is precise.

Initially, injector 130A is located at a particular longitudinal position, sometimes called an initial 0,0 Z axis starting setting, and at a particular angular position, sometimes called an initial 0,0 theta starting setting. This position is identified as position 504. Referring to FIGS. 1 and 5A together, computer 400 controls stepper motor 170 to rotate spindle 300. This rotates stepper motor sprocket 302, which moves belt 306. Movement of belt 306 causes coupling ring sprocket 304, and hence coupling ring 210, to rotate. This rotation is magnetically coupled to slider 114, which also rotates. Since injector 130A is coupled to slider 114, referring now to FIG. 5A, injector 130A rotates. As a result, tip 131A of injector 130A rotates from its first angular position at position 504 to a second angular position identified as a position 506.

Although rotation of tip 131A in a first rotation direction is described, e.g., in the clockwise direction when viewed from below, it is understood that computer 400 can rotate tip 131A in a second rotational direction opposite the first rotational direction, e.g., in the counterclockwise direction when viewed from below, by controlling stepper motor 170 to reverse the rotation of spindle 300.

The longitudinal position of injector 130A is also readily adjustable. Referring to FIG. 5B, initially, injector 130A is located at a particular longitudinal position and a particular angular position, identified as position 504. Referring to FIGS. 1 and 5B together, to adjust the longitudinal position of injector 130A, computer 400 controls stepper motor 160 to extend piston 162. This moves linear ring 164, and hence coupling ring 210, towards outlet plate 104. Since coupling ring 210 is magnetically coupled to slider 114, slider 114 also moves in the longitudinal direction. Since injector 130A is coupled to slider 114, referring now to FIG. 5B, injector 130A moves up and into reactor 133A. As a result, tip 131A of injector 130A moves from its first longitudinal position at position 504 to a second longitudinal position identified as a position 508.

Although longitudinal motion of tip 131A in a first longitudinal direction is described, e.g., in the upward direction from position 504 to position 508, it is understood that computer 400 can move tip 131A in the opposite longitudinal direction, e.g., in the downward direction from position 508 to position 504, by controlling stepper motor 160 to retract piston 162.

In FIG. 5A, injector 130A is rotated. In FIG. 5B, injector 130A is moved in the longitudinal direction. Further, in one embodiment, computer 400 simultaneously rotates injector 130A and moves injector 130A in the longitudinal direction by simultaneously controlling stepper motors 170, 160, respectively (FIG. 1).

FIG. 6A is a block diagram illustrating operations in a process 600A for which gas jet assembly 100 is used in accordance with one embodiment of the present invention. Referring to FIGS. 4 and 6A together, from a start operation 601, the operator supplies the batch identifier, e.g., inputs the batch identifier into computer 400, at a Batch Identifier Operation 602 (hereinafter operation 602). As discussed in detail below, based on the batch identifier, in Injector Position Selection Operation 604 (hereinafter operation 604), computer 400 determines the gas injector position for the process. Unless otherwise indicated, gas injector position refers to a particular angular position and longitudinal position of a gas injector such as injector 130 of FIG. 1. As described herein, computer 400 performs certain functions and/or has certain attributes. However, those of skill in the art will understand that such functions and/or attributes result from execution of instructions by computer 400.

Figure 6C:
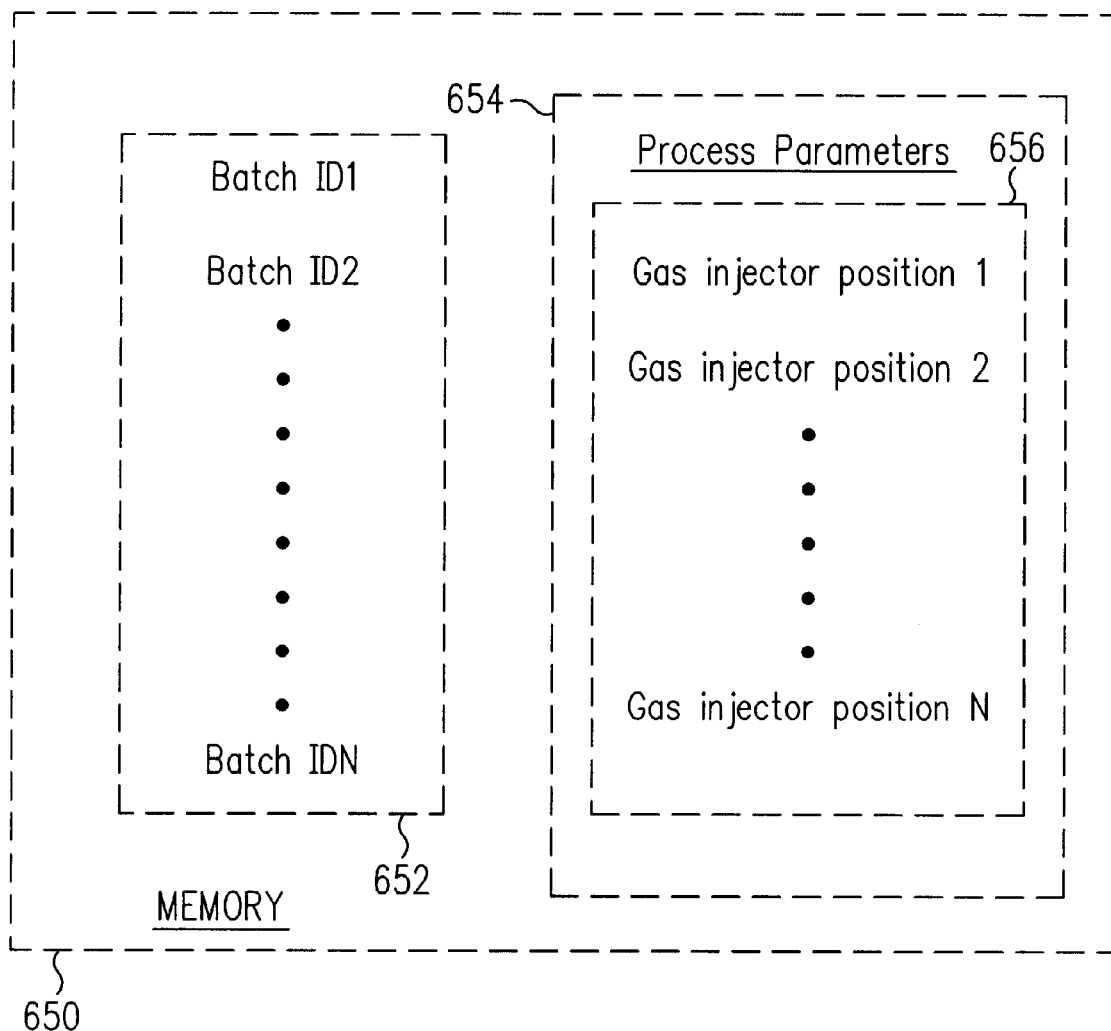
FIG. 6C is a diagram of a memory used by a computer in accordance with one embodiment of the present invention.

FIG. 6C is a diagram of a memory 650 used by computer 400 (FIG. 4) in accordance with one embodiment of the present invention. Memory 650 includes a batch ID table 652 and a process parameter database 654. Batch ID table 652 includes a plurality of batch ID records: batch ID1, batch ID2 . . . batch IDN (hereinafter batch ID records).

Associated with each batch ID record are one or more process parameter records in database 654, e.g., the particular gases used, gas flow rates, and temperatures. Of importance, at least one of these process parameter records is one or more of gas injector position records: gas injector position 1, gas injector position 2 . . . gas injector position N (hereinafter gas injector position records) contained in a gas injector position table 656. Gas injector position table 656 is contained within database 654.

Thus, based on the batch identifier supplied by the operator, a batch ID record is selected from batch ID table 652. Based on the selected batch ID record, one or more gas injector positions are selected from gas injector position table 656. Referring now to FIGS. 4 and 6A together, computer 400 uses the information contained in the particular gas injector position record to determine the appropriate gas injector position as set forth in operation 604. Thus, based on the batch identifier supplied by the operator, a particular gas injector position is selected for the process operation.

While a particular retrieval technique has been described using the batch identifier, those of skill in the art will recognize that equivalent functionality can be achieved using a look-up table, caches or any other techniques that has data sets where each data set has a unique identifier.

Generally, any technique which provides a data set in response to the batch identifier, e.g., a variable input, is used. Further, a wide variety of information can be used as the batch identifier. For example, information such as wafer size, desired growth rate and/or type of process gas is used as part of the batch identifier.

In one embodiment, the batch identifier includes thickness uniformity information from the previous batch. For example, a conventional fourier transform infrared (FTIR) spectrometer unit measures the thickness uniformity of deposited layers on wafers from a previous batch. This thickness uniformity information is input as part of the batch identifier.

In accordance with this embodiment, memory 650 in, or accessible by, computer 400 contains statistical data correlated to thickness uniformity of deposited layers, e.g., in batch ID table 652. For example, this statistical data is obtained by performing a series of test runs where thickness uniformities are measured for a series of gas injector positions. To illustrate, the injector is moved in fixed increments and the thickness uniformity is measured at each increment. Thus, for any particular thickness uniformity, the proper process parameters, including the proper gas injector position, to optimize the thickness uniformity for the next batch are retrieved from memory 650 and used by computer 400 as set forth in operation 604.

To illustrate, the thickness uniformity of the last batch indicates that the deposited layer on the wafers is too thick near the edges of the wafers compared to the thickness near the centers of the wafers. This thickness uniformity information is input as part of the batch identifier. Based on this thickness uniformity information, the proper gas injector position to optimize the thickness uniformity for the next batch is retrieved from memory 650 and used by computer 400 as set forth in operation 604. For example, it may be determined that the injector should be extended in the longitudinal direction to a higher gas injector position, e.g., moved from position 504 to position 508 of FIG. 5B, to increase the thickness of the deposited layer near the centers of the wafers and decrease the thickness near the edges of the wafers.

In a Position Injector Operation 606 (hereinafter operation 606), computer 400 causes, i.e., generates a signal that in turn causes, the injector to move to the gas injector position which was determined in operation 604. Advantageously, the injector is moved automatically to the gas injector position which was determined in operation 604 without manual intervention.

In Perform Process Operation 608 (hereinafter operation 608), computer 400 causes the process operation to be performed, e.g., causes heating of the substrates and causes process gas to flow into reactor 133A so that a layer is deposited on the substrates. The substrates are loaded into reactor 133A as part of this process operation or, alternatively, are loaded prior to the process operation, e.g., are loaded before operation 602.

At Additional Batch Determination Operation 610 (hereinafter operation 610), computer 400 determines whether there are one or more additional batches of substrates which need to be processed. If not, then at End Operation 612 (hereinafter operation 612), processing is complete and the processed substrates are removed from reactor 133A. p However, if at operation 610, computer 400 determines that one or more additional batches of substrates are still to be processed, then returning to operation 608, the processed substrates are removed and new substrates are loaded into reactor 133A. Computer 400 causes the process operation to be performed on the new substrates. Operations 608, 610 are repeated until all batches of substrates are processed.

FIG. 6B is a block diagram illustrating operations in a process 620 for which gas jet assembly 100 is used in accordance with another embodiment of the present invention. Start Operation 601A, Batch Identifier Operation 602A, Injection Position Selection Operation 604A, Position Injector Operation 606A and Perform Process Operation 608A (hereinafter operations 601A, 602A, 604A, 606A, 608A, respectively) of FIG. 6B are substantially similar to operations 601, 602, 604, 606, 608, respectively, of FIG. 6A and so are not discussed in detail to avoid detracting from the principals of the invention.

Referring now to FIG. 6B, from operation 608A and at Additional Process Operations Determination Operation 614 (hereinafter operation 614), computer 400 determines whether there are additional process operations which still need to be performed. If at operation 614, computer 400 determines that additional process operations are still required, then, returning to operation 604A, the next gas injector position for the next process operation is selected. More particularly, computer 400 determines the next gas injector position for the next process operation.

For example, referring to FIG. 6C, computer 400 determines the next gas injector position from a gas injector position record retrieved from gas injector position table 656, i.e., a plurality of gas injector positions are associated with the batch identifier. At operation 606A, computer 400 causes the injector to move to the next gas injector position. At operation 608A, computer 400 causes the next process operation to be performed. Operations 604A, 606A, and 608A are repeated until all process operations are completed.

As an illustration, the first process operation is an etch cleaning of the substrates. At operation 604A, computer 400 determines the first gas injector position for the etch cleaning of the substrates. At operation 606A, computer 400 moves the injector to the first gas injector position. At operation 608A, the substrates are etch cleaned.

At operation 614, computer 400 determines that a second process operation is still to be performed. For example, the second process operation is a layer deposition on the substrates. Returning to operation 604A, computer 400 determines the new second gas injector position for this second process operation. This second gas injector position may be the same as, or different from, the first gas injector position for the first process operation. At operation 606A, computer 400 causes the injector to move to the second gas injector position. At operation 608A, the layer is deposited on the substrate. At operation 614, computer 400 determines that there are no additional process operations to be performed.

Thus, in accordance with the present invention, the injector is moved to a gas injector position which provides the best results for each process operation. In this manner, each process operation is optimized. This is in contrast to the prior art wherein a single gas injector position was used for all process operations, and this single gas injector position was less than ideal depending upon the particular process operation.

If computer 400 determines that there are no additional process operations which still need to be performed, then at Additional Batch Determination Operation 610A (hereinafter operation 610A), computer 400 determines whether there are one or more additional batches of substrates which need to be processed. If not, then at End Operation 612A (hereinafter operation 612A), processing is complete and the processed substrates are removed from reactor 133A. Although each batch is described herein as having a plurality of substrates, generally, a batch has one or more substrates.

However, if at operation 610A, computer 400 determines that one or more additional batches of substrates are still to be processed, then at Measure Substrate Characteristics Operation 616 (hereinafter operation 616), the processed substrate characteristics are measured. For example, the thickness uniformity of the deposited layer on a least one of the processed substrates is measured using a cluster tool layer thickness measurement apparatus such as that described in Moore, U.S. Pat. No. 5,872,632, which is herein incorporated by reference in its entirety.

After the processed substrate characteristics are measured, then at operation 602A, these measured characteristics are used as the batch identifier. Advantageously, computer 400 directly measures the processed substrate characteristics at operation 616 and uses these measured characteristics in operation 602 automatically and without manual intervention. Alternatively, operation 616 is not performed, i.e., upon determining that one or more additional batches of substrates are still to be processed at operation 610A, batch identifier operation 602A is performed.

At operation 604A, computer 400 determines the new gas injector position for the process (or for the first process operation of the process) for the next batch of substrates. Of importance, the new gas injector position is based on the processed substrate characteristics from the previous batch. At operation 606A, computer 400 causes the injector to move to the new injector position, which was determined in operation 604A. At operation 608A, computer 400 causes the process operation to be performed. Operations 604A, 606A, and 608A are repeated until all process operations are complete on the new batch. Further, operations 602A, 604A, 606A, 608A, 614, 610A and, optionally, operation 616 are repeated until all batches of substrates are processed. For each cycle, processed substrates are removed and new substrates are loaded into reactor 133A during one or more of operations 602A, 604A, 606A, 608A, 614, 610A, 616, e.g., during operation 608A or 616.

Advantageously, processed substrate characteristics from the previous batch are used to optimize the gas injector position for the next batch. In this manner, deviations in process conditions from batch to batch are automatically compensated for resulting in consistent substrate processing from batch to batch.

As described above, the injector in accordance with the present invention is static, i.e., remains stationary during performance of operation 608A. In accordance with an alternative embodiment of the present invention, the injector is dynamic, e.g., rotates and/or moves in the longitudinal direction, during performance of operation 608A.

In one embodiment, the injector is continuously rotated in a first direction, e.g., clockwise or counterclockwise, during performance of operation 608A. In another embodiment, the injector is continuously rotated back and forth, i.e., rotationally oscillated, during operation 608A. In either of these embodiments, optionally, the injector is also continuously extended and retracted in the longitudinal direction, i.e., is a longitudinally oscillated.

FIG. 7 is a block diagram illustrating operations in a process 700 for which gas jet assembly 100 is used in accordance with yet another embodiment of the present invention. Referring to FIGS. 4 and 7 together, after the injector is moved into the proper position in operation 606A (FIG. 6B), in an Initiate Process Operation 701 (hereinafter operation 701), computer 400 initiates the process operation. For example, computer 400 controls heating of the substrates and process gas flow into reactor 133A.

In an Operational Conditions Monitoring Operation 702 (hereinafter operation 702), the operational conditions in reactor 133A are monitored by computer 400 during the process operation. For example, the pressure inside of reactor 133A is measured using conventional techniques, e.g., by one or more capacitance manometers. As a further example, the temperature, such as substrate temperature, is measured using conventional techniques, e.g., by a thermocouple.

In an Optimum Injector Position Selection Operation 704 (hereinafter operation 704), computer 400 determines the optimum gas injector position based on the monitored operational conditions. To determine the optimum gas injector position, memory 650 (FIG. 6C) in, or accessible by, computer 400 contains statistical data correlated to operational conditions. For example, this statistical data is obtained by performing a series of test runs where operational conditions are measured for a series of gas injector positions. Thus, for any particular operational condition, the optimum gas injector position is retrieved from memory 650 as set forth in operation 704. Although retrieval of the optimum gas injector position from memory 650 is set forth, in light of this disclosure, those of skill in the art will understand that other techniques to determine the optimum gas injector position for the particular operational conditions can be used. For example, the particular operational conditions are input as variables into a formula used to calculate the optimum gas injector position.

To illustrate, temperature measurements obtained in operation 702 indicate that a significant temperature gradient exists in reactor 133A. Based on these temperature measurements, computer 400 determines the optimum gas injector position as set forth in operation 704. For example, it may be determined that the injector should be extended in the longitudinal direction to a higher gas injector position, e.g., moved from position 504 to position 508 of FIG. 5B, to decrease the temperature gradient in reactor 133A and thus improve the thickness uniformity of the deposited layer.

In an Optimally Position Injector Operation 706 (hereinafter operation 706), computer 400 controls gas jet assembly 100A and moves the injector to the optimum gas injector position determined in operation 704. In a Process Operation Completed Determination Operation 708 (hereinafter operation 708), computer 400 determines if the process operation is complete. If the process operation is complete, then the next operation is operation 614 in FIG. 6B.

If in operation 708, computer 400 determines that the process operation is not complete, then process flow returns to operation 702. In operation 702, computer 400 again monitors operational conditions. Based on these monitored operational conditions, in operation 704, computer 400 determines the new second optimum gas injector position.

For example, it may be the case that the injector was overextended, e.g., moved from position 504 to position 508 of FIG. 5B, to compensate for an earlier existing first temperature gradient in reactor 133A and that now an opposite second temperature gradient exists. Thus, computer 400 determines that the injector should be retracted, e.g., referring to FIG. 5B, moved from position 508 to a location between positions 504, 508, to a new second optimum gas injector position to decrease the now existing second temperature gradient and thus improve the thickness uniformity of the deposited layer.

In operation 706, computer 400 controls the injector to move to the new second optimum position. Operations 702, 704 and 706 are repeated until the process operation is complete.

Thus, in accordance with the present invention, the gas injector position is responsive to the operational conditions existing in the reactor at all times. In this manner, instantaneous deviations in operational conditions are automatically compensated for resulting in the most optimum processing of the substrates.

This application is related to Moore et al., co-filed and commonly assigned U.S. patent application Ser. No. 09/500, 696, entitled "SEMICONDUCTOR PROCESSING REACTOR CONTROLLABLE GAS JET ASSEMBLY", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A method of controlling a gas injector in a semiconductor processing reactor comprising:
    selecting a first gas injector position for a first process operation;
    moving said gas injector automatically to said first gas injector position without manual intervention;
    performing said first process operation; and
    selecting a second gas injector position for a second process operation.

2. The method of claim 1 further comprising moving said gas injector to said second gas injector position.

3. The method of claim 2 further comprising performing said second process operation.

4. The method of claim 3 further comprising determining whether there are additional process operations.

5. A method of controlling a gas injector in a semiconductor processing reactor comprising:
    supplying a batch identifier, wherein process parameters including a first gas injector position are associated with said batch identifier;
    selecting said first gas injector position for a first process operation;
    moving said gas injector automatically to said first gas injector position without manual intervention; and
    performing said first process operation.

6. The method of claim 1 wherein said performing said first process operation comprises causing substrates in said semiconductor processing reactor to be heated.

7. The method of claim 6 wherein said performing said first process operation comprises causing process gas to flow into said semiconductor processing reactor.

8. The method of claim 1 wherein said gas injector remains stationary during said first process operation.

9. A method of controlling a gas injector in a semiconductor processing reactor comprising:
    selecting a first gas injector position for a first process operation;
    moving said gas injector automatically to said first gas injector position without manual intervention; and
    performing said first process operation, wherein said gas injector is moved during said first process operation.

10. The method of claim 9 wherein said gas injector is rotated during said first process operation.

11. The method of claim 9 wherein said gas injector is longitudinally oscillated during said first process operation.

12. The method of claim 1 wherein a first batch is processed during said first process operation, said method further comprising determining whether there are one or more additional batches which need to be processed.

13. The method of claim 12 further comprising measuring characteristics of a first substrate of said first batch.

14. The method of claim 13 wherein a layer is deposited on said first substrate during said first process operation, said measuring characteristics of a first substrate comprising measuring a thickness uniformity of said layer.

15. The method of claim 13 further comprising selecting said second gas injector position based on said characteristics of said first substrate.

16. The method of claim 15 further comprising moving said gas injector automatically to said second gas injector position without manual intervention.

17. The method of claim 15 where in said second gas injector position is the same as said first gas injector position.

18. A method of controlling a gas injector in a semiconductor processing reactor comprising:
    initiating a process operation; and
    moving said gas injector during said process operation.

19. The method of claim 18 further comprising:
    monitoring first operational conditions during said process operation; and
    determining a first gas injector position based on said first operational conditions.

20. The method of claim 19 further comprising moving said gas injector to said first gas injector position.

21. The method of claim 20 further comprising determining that said process operation is not complete.

22. The method of claim 21 further comprising:
    monitoring second operational conditions during said process operation; and determining a second gas injector position based on said second operational conditions.

23. The method of claim 22 further comprising moving said gas injector to said second gas injector position.

24. The method of claim 18 wherein said moving comprises rotating said gas injector.

25. The method of claim 18 wherein said moving comprises longitudinally oscillating said gas injector.

26. A method of controlling a gas injector in a semiconductor processing reactor comprising:

selecting a first gas injector position for a first process operation on a substrate;

moving said gas injector automatically to said first gas injector position without manual intervention;

performing said first process operation on said substrate; and selecting a second gas injector position for a second process operation on said substrate.

* * * * *